US008878278B2

(12) United States Patent
Alsmeier et al.

(10) Patent No.: US 8,878,278 B2
(45) Date of Patent: Nov. 4, 2014

(54) COMPACT THREE DIMENSIONAL VERTICAL NAND AND METHOD OF MAKING THEREOF

(71) Applicant: SanDisk Technologies, Inc., Plano, TX (US)

(72) Inventors: Johann Alsmeier, San Jose, CA (US); Raghuveer S. Makala, Sunnyvale, CA (US); Xiying Costa, San Jose, CA (US); Yanli Zhang, San Jose, CA (US)

(73) Assignee: Sandisk Technologies Inc., Plano, TX (US)

( * ) Notice: Subject to any disclaimer, the term of this patent is extended or adjusted under 35 U.S.C. 154(b) by 101 days.

(21) Appl. No.: 13/754,293

(22) Filed: Jan. 30, 2013

(65) Prior Publication Data

US 2013/0248974 A1    Sep. 26, 2013

Related U.S. Application Data

(60) Provisional application No. 61/613,630, filed on Mar. 21, 2012.

(51) Int. Cl.
*H01L 21/84* (2006.01)
*H01L 27/115* (2006.01)
*G11C 16/04* (2006.01)
*H01L 29/788* (2006.01)
*H01L 29/66* (2006.01)
*H01L 29/792* (2006.01)
*H01L 21/764* (2006.01)

(52) U.S. Cl.
CPC ........ *H01L 29/788* (2013.01); *H01L 27/11556* (2013.01); *H01L 27/11582* (2013.01); *H01L 27/11524* (2013.01); *G11C 16/04* (2013.01); *H01L 29/7889* (2013.01); *H01L 29/66833* (2013.01); *H01L 27/11519* (2013.01); *H01L 27/1157* (2013.01); *H01L 27/11565* (2013.01); *H01L 29/66825* (2013.01); *H01L 29/7926* (2013.01); *H01L 21/764* (2013.01)
USPC .... 257/314; 257/316; 257/319; 257/E29.309; 257/E27.103; 257/E21.679

(58) Field of Classification Search
CPC ............ H01L 27/0688; H01L 27/1157; H01L 27/11578; H01L 27/11524; H01L 27/11568; H01L 29/792; H01L 29/42336; H01L 29/42324; H01L 29/66833
USPC ......... 257/314–325, E21.679, 27.103, 29.309
See application file for complete search history.

(56) References Cited

U.S. PATENT DOCUMENTS

| | | | |
|---|---|---|---|
| 7,177,191 | B2 | 2/2007 | Fasoli et al. |
| 7,221,588 | B2 | 5/2007 | Fasoli et al. |

(Continued)

FOREIGN PATENT DOCUMENTS

| | | |
|---|---|---|
| WO | WO02/15277 A2 | 2/2002 |
| WO | 2009085078 A1 | 7/2009 |
| WO | 2012003301 A2 | 1/2012 |

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.

(Continued)

*Primary Examiner* — Michael Lebentritt
(74) *Attorney, Agent, or Firm* — The Marbury Law Group PLLC

(57) ABSTRACT

A NAND device has at least a 3×3 array of vertical NAND strings in which the control gate electrodes are continuous in the array and do not have an air gap or a dielectric filled trench in the array. The NAND device is formed by first forming a lower select gate level having separated lower select gates, then forming plural memory device levels containing a plurality of NAND string portions, and then forming an upper select gate level over the memory device levels having separated upper select gates.

24 Claims, 34 Drawing Sheets

(56) References Cited

U.S. PATENT DOCUMENTS

| | | | |
|---|---|---|---|
| 7,233,522 | B2 | 6/2007 | Chen et al. |
| 7,514,321 | B2 | 4/2009 | Mokhlesi et al. |
| 7,575,973 | B2 | 8/2009 | Mokhlesi et al. |
| 7,745,265 | B2 | 6/2010 | Mokhlesi et al. |
| 7,808,038 | B2 | 10/2010 | Mokhlesi et al. |
| 7,848,145 | B2 | 12/2010 | Mokhlesi et al. |
| 7,851,851 | B2 | 12/2010 | Mokhlesi et al. |
| 8,008,710 | B2 | 8/2011 | Fukuzumi |
| 8,053,829 | B2 | 11/2011 | Kang et al. |
| 8,187,936 | B2 | 5/2012 | Alsmeier et al. |
| 8,193,054 | B2 | 6/2012 | Alsmeier |
| 8,198,672 | B2 | 6/2012 | Alsmeier |
| 8,349,681 | B2 | 1/2013 | Alsmeier et al. |
| 8,450,791 | B2 * | 5/2013 | Alsmeier ............. 257/319 |
| 8,659,944 | B2 * | 2/2014 | Hung et al. ......... 365/185.17 |
| 8,765,543 | B2 * | 7/2014 | Alsmeier et al. ........ 438/216 |
| 2004/0232472 | A1 * | 11/2004 | Sakui et al. ............ 257/314 |
| 2007/0210338 | A1 | 9/2007 | Orlowski |
| 2007/0252201 | A1 | 11/2007 | Kito et al. |
| 2008/0067583 | A1 | 3/2008 | Kidoh |
| 2009/0121271 | A1 | 5/2009 | Son |
| 2009/0179248 | A1 * | 7/2009 | Park et al. ............. 257/314 |
| 2009/0242967 | A1 | 10/2009 | Katsumata |
| 2010/0044778 | A1 | 2/2010 | Seol |
| 2010/0059811 | A1 | 3/2010 | Sekine |
| 2010/0112769 | A1 | 5/2010 | Son et al. |
| 2010/0120214 | A1 | 5/2010 | Park et al. |
| 2010/0148237 | A1 | 6/2010 | Kito |
| 2010/0155810 | A1 | 6/2010 | Kim et al. |
| 2010/0155818 | A1 | 6/2010 | Cho |
| 2010/0181610 | A1 | 7/2010 | Kim et al. |
| 2010/0207193 | A1 | 8/2010 | Tanaka |
| 2010/0207195 | A1 | 8/2010 | Fukuzumi et al. |
| 2010/0320528 | A1 | 12/2010 | Jeong et al. |
| 2011/0076819 | A1 | 3/2011 | Kim et al. |
| 2011/0133606 | A1 | 6/2011 | Yoshida et al. |
| 2011/0266606 | A1 | 11/2011 | Park et al. |
| 2012/0001247 | A1 | 1/2012 | Alsmeier |
| 2012/0001249 | A1 * | 1/2012 | Alsmeier et al. ......... 257/319 |
| 2012/0052674 | A1 | 3/2012 | Lee |
| 2014/0131787 | A1 * | 5/2014 | Alsmeier ............. 257/321 |
| 2014/0138760 | A1 * | 5/2014 | Makala et al. ........ 257/321 |
| 2014/0141583 | A1 * | 5/2014 | Hung et al. .......... 438/237 |
| 2014/0175530 | A1 * | 6/2014 | Chien et al. .......... 257/321 |
| 2014/0225181 | A1 * | 8/2014 | Makala et al. ........ 257/321 |

OTHER PUBLICATIONS

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Endoh et al., "Novel Ultra High Density Memory with a Stacked-Surrounding Gate Transistor (S-SGT) Structured Cell," IEDM Proc. (2001) 33-36.

Tanaka et al., "Bit-Cost Scalable Technology for Low-Cost and Ultrahigh-Density Flash Memory," Toshiba Review, vol. 63, No. 2, 2008, pp. 28-31.

Masahide Kimura, "3D Cells Make Terabit NAND Flash Possible," Nikkei Electronics Asia, Sep. 17, 2009, 6pgs.

International Search Report & Written Opinion, PCT/US2011/042566, Jan. 17, 2012.

Invitation to Pay Additional Fees & Partial International Search Report, PCT/US2011/042566, Sep. 28, 2011.

U.S. Appl. No. 13/443,287, Johann Alsmeier et al., "Vertical NAND Device with Low Capacitance and Silicided Word Lines," filed Apr. 10, 2012, Specification and drawings.

U.S. Appl. No. 13/478,483, Yao-Sheng Lee et al., Multi-Level Contact to a 3D Memory Array and Method of Making, filed May 23, 2012, Specification and drawings.

Jang et al., "Memory Properties of Nickel Silicide Nanocrystal Layer for Possible Application to Nonvolatile Memory Devices," IEEE Transactions on Electron Devices, vol. 56, No. 12, Dec. 2009.

Chen et al., "Reliability Characteristics of NiSi Nanocrystals Embedded in Oxide and Nitride Layers for Nonvolatile Memory Application," Applied Physics Letters 92, 152114 (2008).

U.S. Appl. No. 13/544,328, Raghuveer S. Makala et al., "Three Dimensional NAND Device and Method of Charge Trap Layer Separation and Floating Gate Formation in the NAND Device", filed Jul. 9, 2012, Specification and drawings.

U.S. Appl. No. 13/083,775, Johann Alsmeier, "3D Vertical NAND and Method of Making Thereof by Front and Back Side Processing", filed Apr. 11, 2011, Specification and drawings.

U.S. Appl. No. 13/443,287, Johann Alsmeier et al., "Vertical NAND Device with Low Capacitance and Silicided Word Lines", filed Apr. 10, 2012, Specification and drawings.

J. Ooshita, Toshiba Announces 32Gb 3D-Stacked Multi-Level NAND Flash, 3 pages, http://techon.nikkeibo.co.jp/english/News_EN/20090619/171977/ Nikkei Microdevices, Tech-On, Jun. 19, 2009.

International Search Report & Written Opinion issued in PCT Application No. PCT/US2012/032870, mailed on Jun. 27, 2012.

International Search Report and Written Opinion received in connection with international application No. PCT/US2013/024638; mailed Jul. 8, 2013.

Invitation to Pay Additional Search Fees issued in PCT Application No. PCT/US13/24638, mailed on Apr. 24, 2013.

* cited by examiner

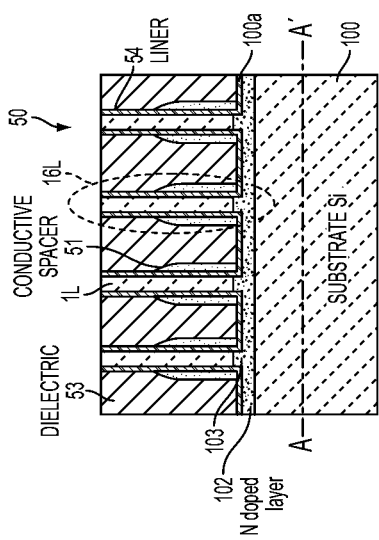
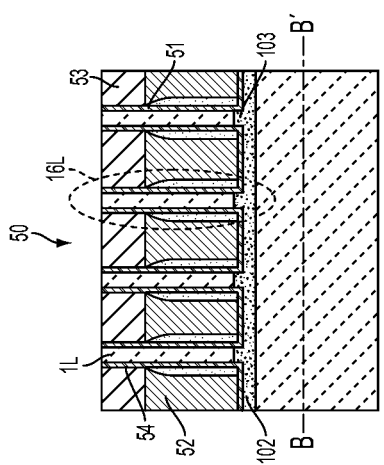
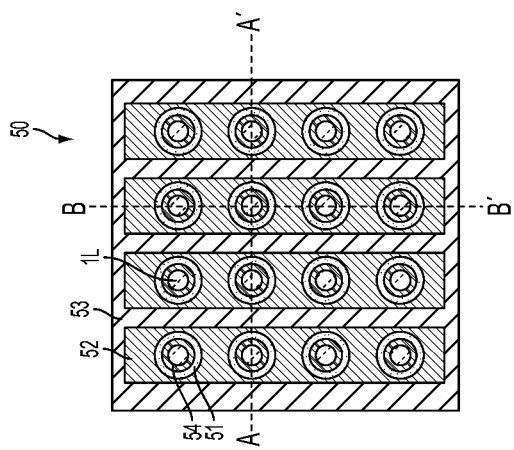

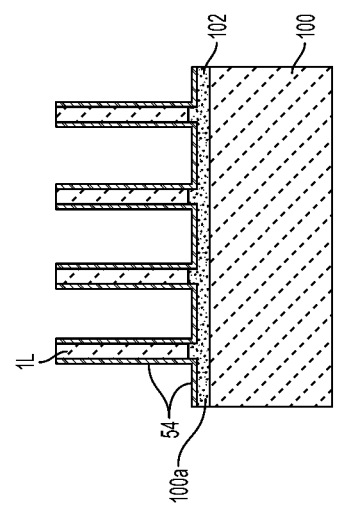
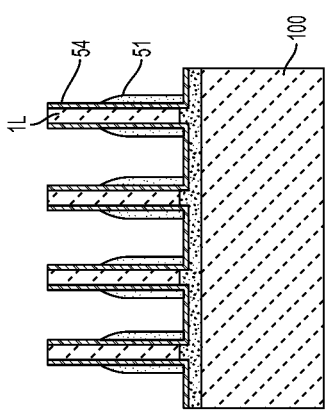
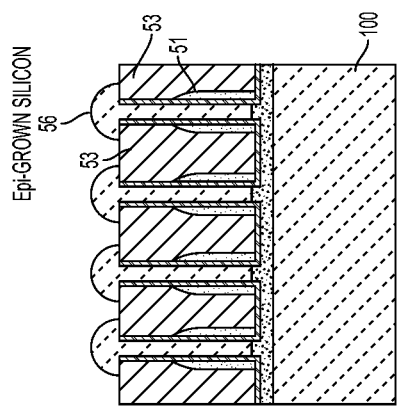
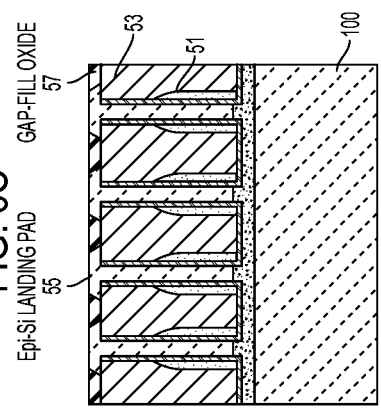

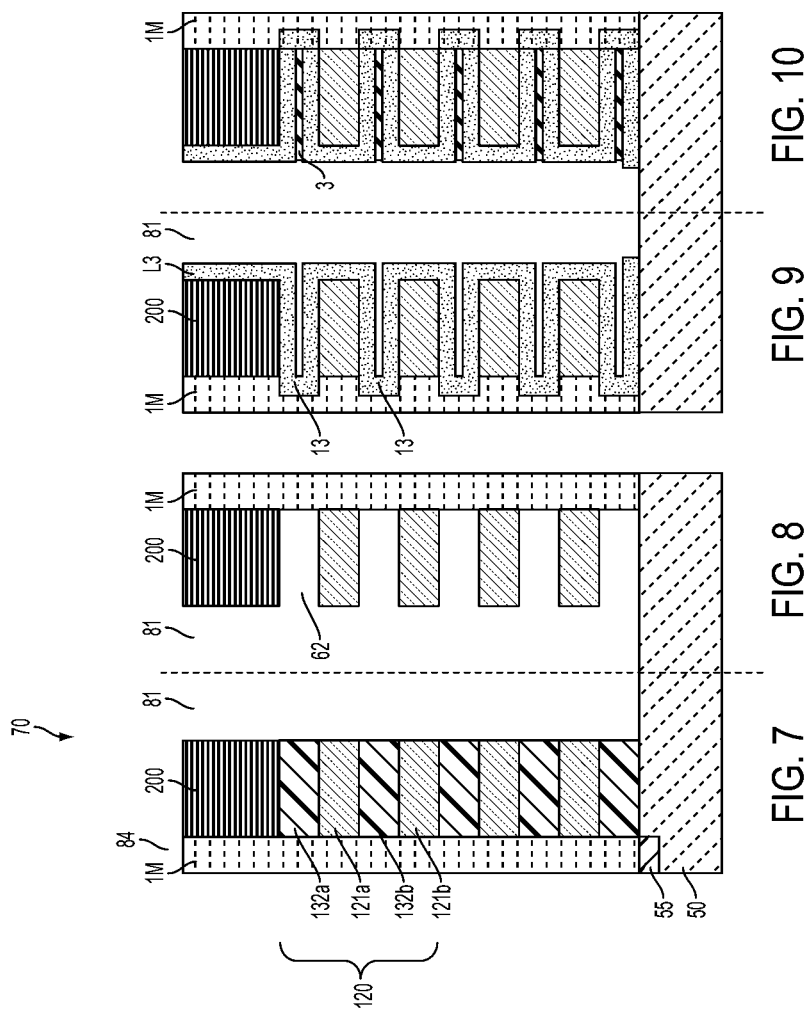

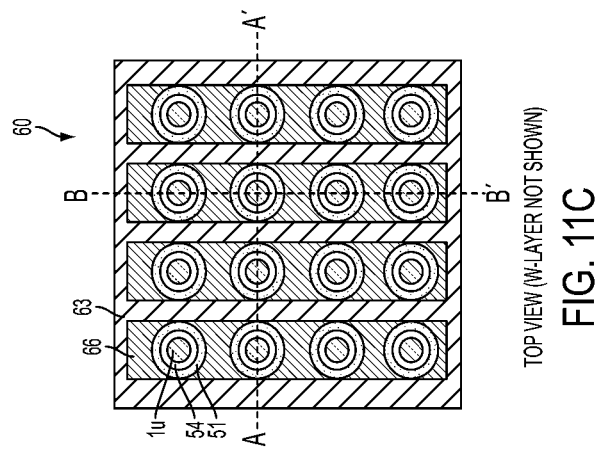
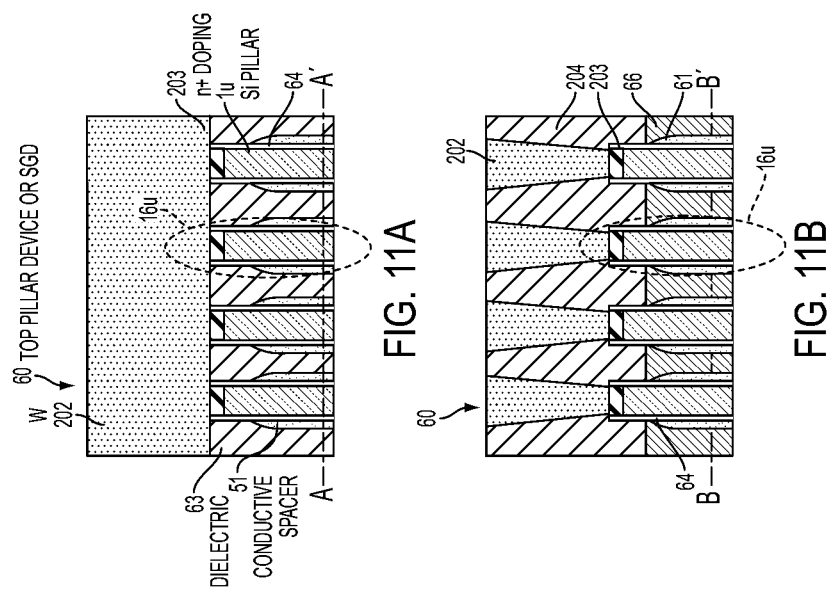

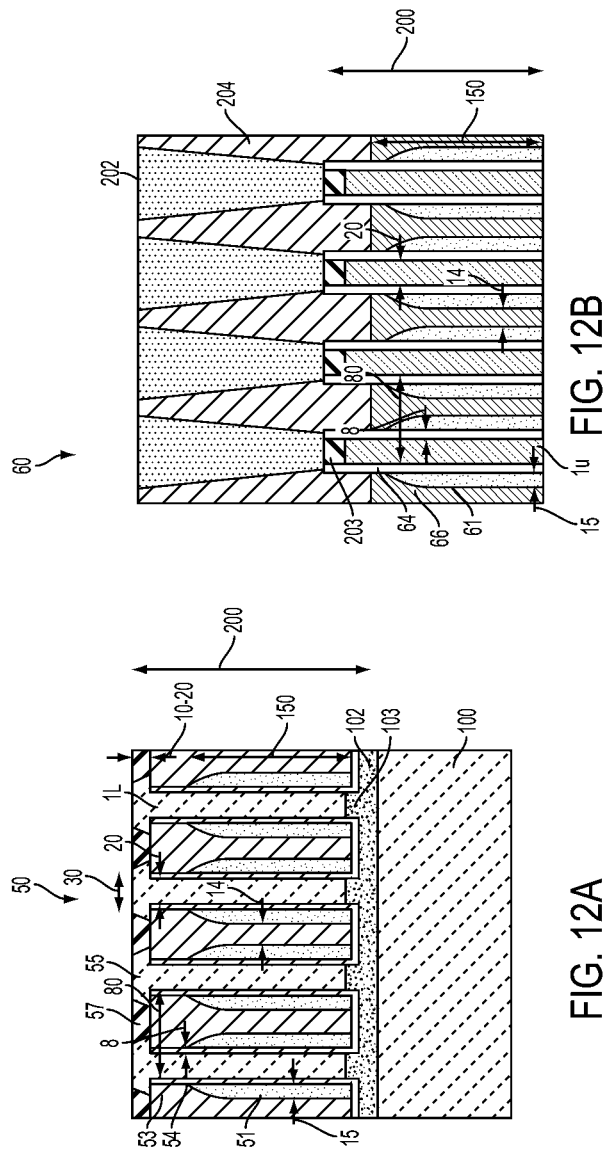

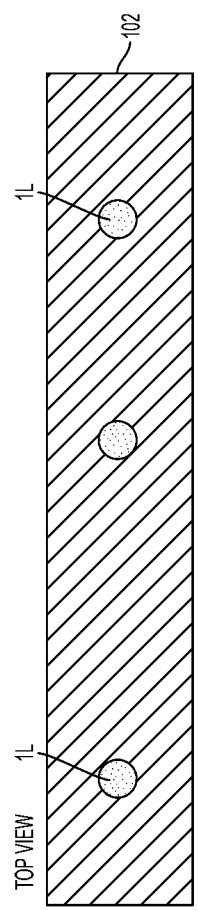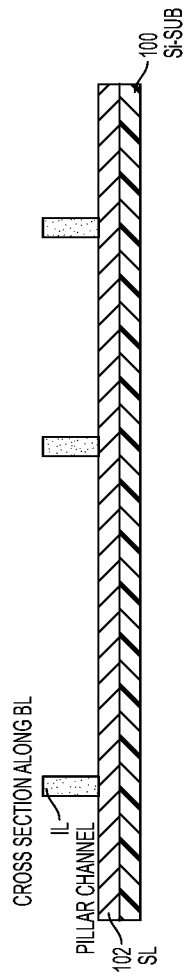

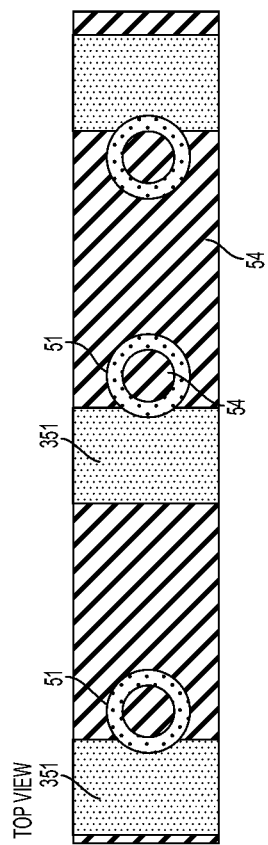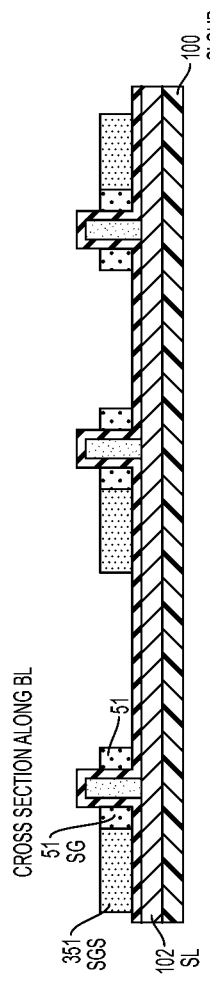

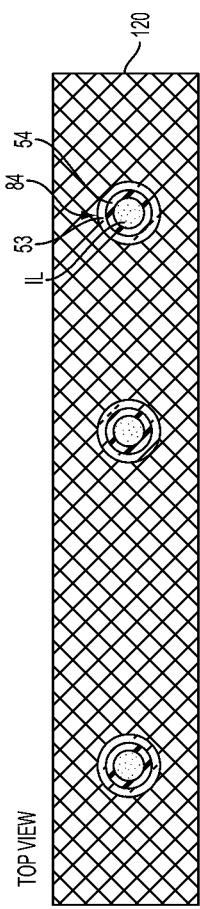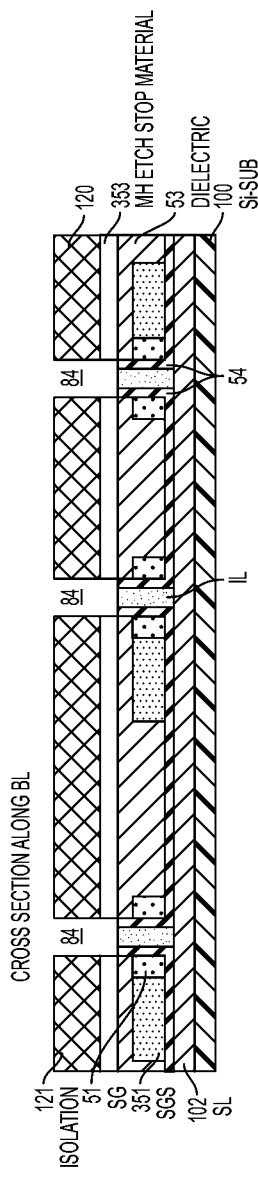

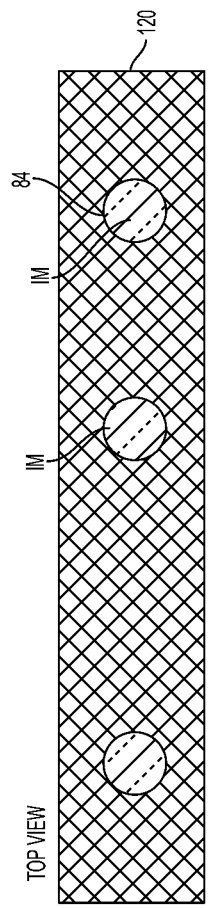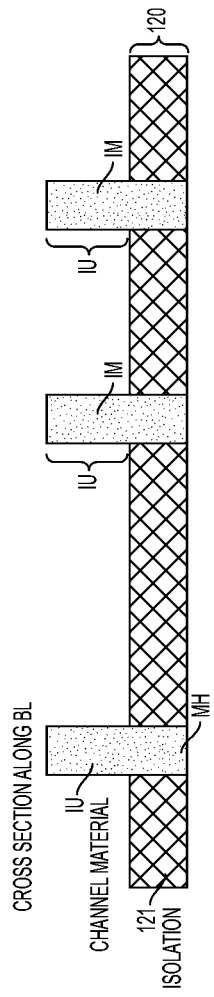

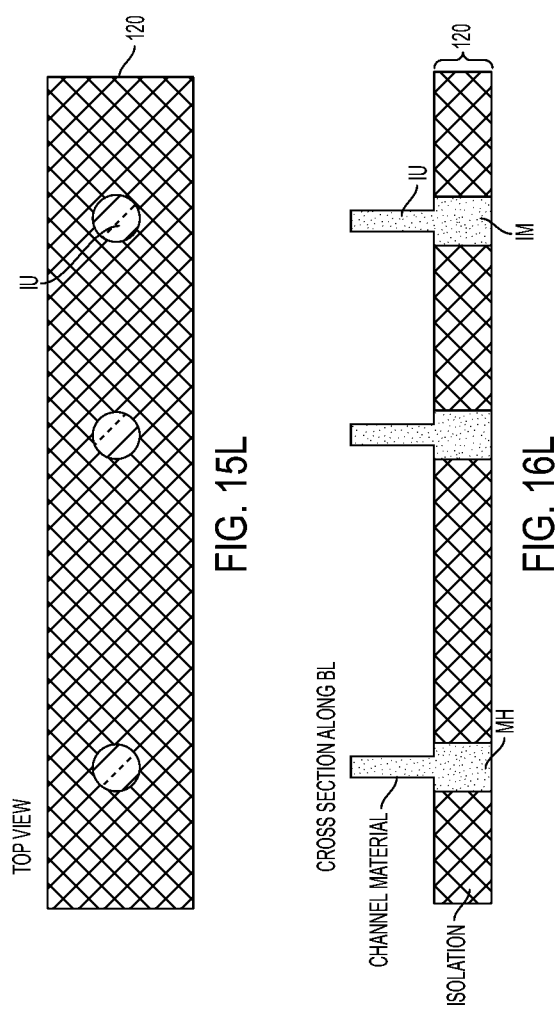

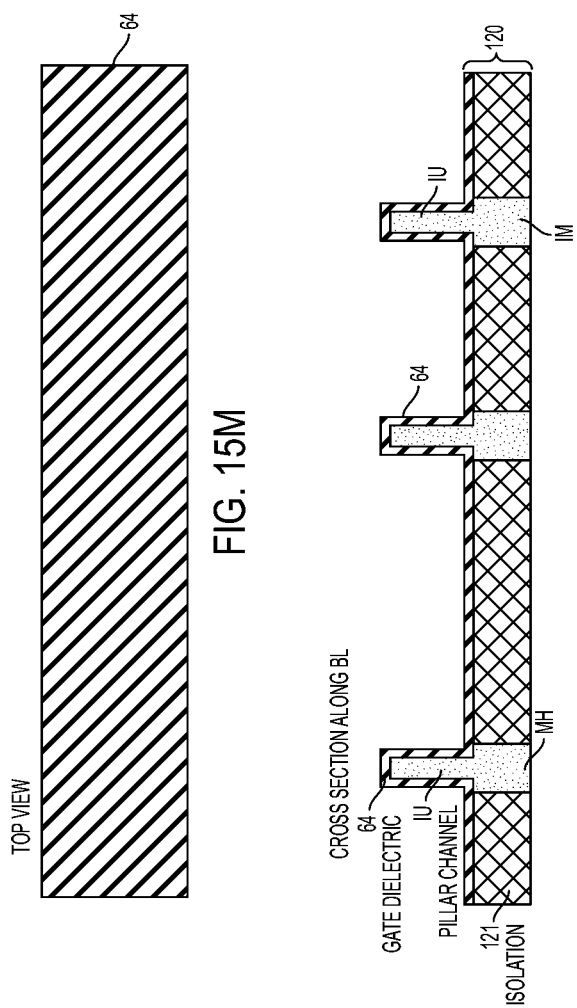

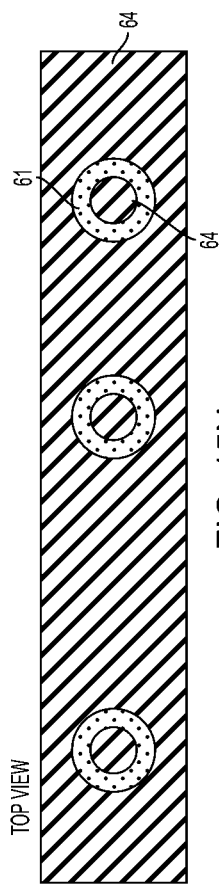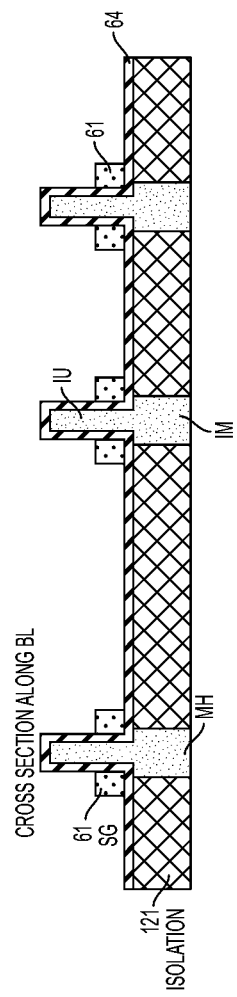

US 8,878,278 B2

COMPACT THREE DIMENSIONAL VERTICAL NAND AND METHOD OF MAKING THEREOF

The present application claims benefit of U.S. Provisional Application Ser. No. 61/613,630 filed on Mar. 21, 2012, which is incorporated herein by reference in its entirety.

FIELD

The present invention relates generally to the field of semiconductor devices and specifically to three dimensional vertical NAND strings and other three dimensional devices and methods of making thereof.

BACKGROUND

Examples of prior art three dimensional vertical NAND strings are illustrated in FIGS. 1A and 1B. The device shown in FIG. 1A is known in the art as terabit cell array transistor ("TCAT") array. It includes damascened metal gate SONOS type cells in the vertical NAND flash string formed by a gate replacement process (see Jang, et al., "Vertical cell array using TCAT (Terabit Cell Array Transistor) technology for ultra high density NAND flash memory," 2009 Symposium on VLSI Technology Digest of Technical Papers, pages 192-193, Jun. 16, 2009, Honolulu, Hi., incorporated herein by reference in its entirety).

The device shown in FIG. 1B is known in the art as Pipe-shaped Bit Cost Scalable ("P-BiCS") flash memory (see Katsumata, et al., "Pipe-shaped BiCS Flash Memory with 16 Stacked Layers and Multi-Level-Cell Operation for Ultra High Density Storage Devices," 2009 Symposium on VLSI Technology Digest of Technical Papers, pages 136-137, Jun. 16, 2009, Honolulu, Hi., incorporated herein by reference in its entirety).

SUMMARY

A NAND device has at least a 3×3 array of vertical NAND strings in which the control gate electrodes are continuous in the array and do not have an air gap or a dielectric filled trench in the array. The NAND device is formed by first forming a lower select gate level having separated lower select gates, then forming plural memory device levels containing a plurality of NAND string portions, and then forming an upper select gate level over the memory device levels having separated upper select gates.

BRIEF DESCRIPTION OF THE DRAWINGS

FIGS. 5A and 5B are perpendicular side cross sectional views along lines A-A' and B-B' in FIG. 5C of a lower select gate device level of the NAND memory device of an embodiment of the invention. FIG. 5C is a top cross sectional view of the device of FIGS. 5A and 5B.

FIGS. 6A, 6B, 6C and 6D are side cross sectional views of steps in the method of making the lower select gate device level of the NAND memory device of an embodiment of the invention.

FIGS. 7, 8, 9 and 10 are side cross sectional views of steps in the method of making the memory device levels of the NAND memory device of an embodiment of the invention.

FIGS. 11A and 11B are perpendicular side cross sectional views along lines A-A' and B-B' in FIG. 11C of an upper select gate device level of the NAND memory device of an embodiment of the invention. FIG. 11C is a top cross sectional view of the device of FIGS. 11A and 11B.

FIGS. 12A and 12B are side cross sectional views of respective lower and upper select gate device level of the NAND memory device of an embodiment of the invention.

DETAILED DESCRIPTION OF THE EMBODIMENTS

The present inventors realized that both TCAT and P-BiCS have less than optimum density due to the presence of trenches between adjacent vertical NAND strings. For example, as shown in FIG. 1A and schematically in FIG. 2A, each TCAT NAND string 180 is separated from adjacent strings by a word line cut or trench 86. The bottom source select gate (SGS) device in TCAT requires a cut space or trench 86 between the lower select gate electrodes which are built from the bottom of the stack metal layer. Furthermore, the source line 102 formation process and p-well 300 contact requires additional space in the TCAT device.

Figure 1B:
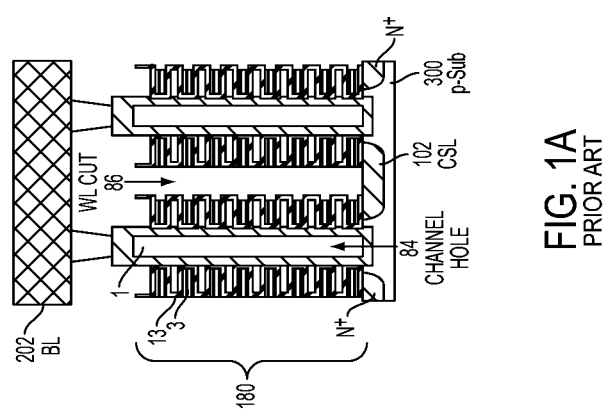
FIG. 1B is a perspective cross sectional view of a prior art NAND memory device.
Figure 1A:
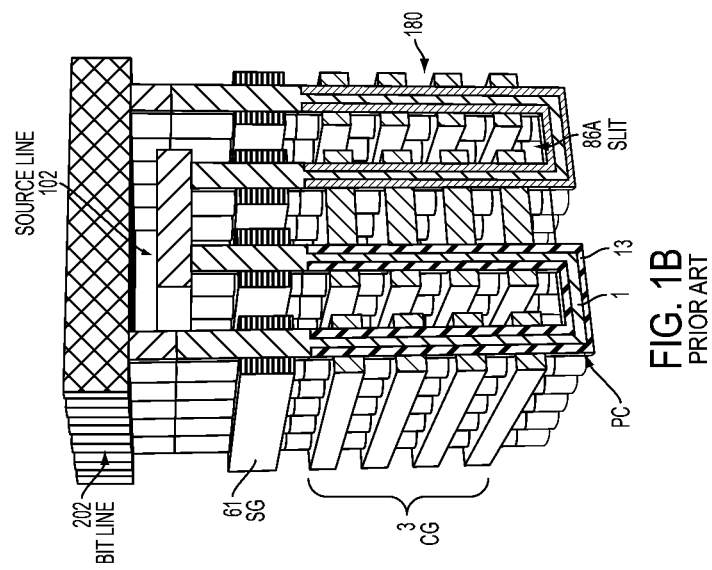
FIGS. 1A, 2A and 2B are side cross sectional views of prior art NAND memory devices.
Figure 2B:
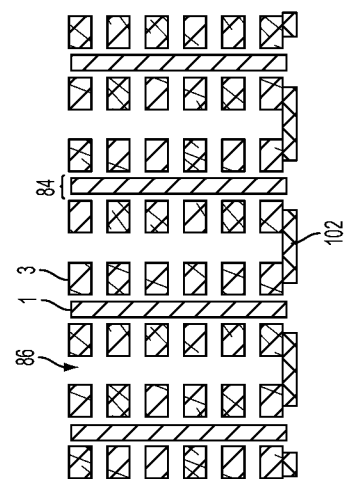
Figure 2A:
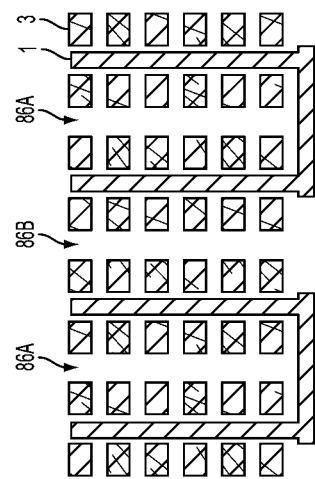
Figure 2C:
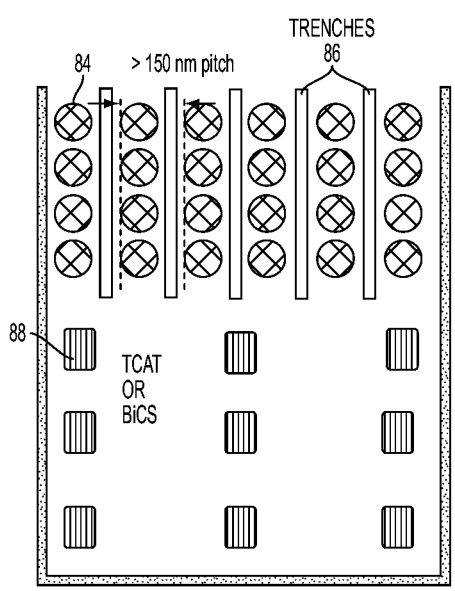
FIG. 2C is a top cross sectional view of a prior art NAND memory device.

Likewise, as shown in FIG. 1B and schematically in FIG. 2B, each U-shaped (also referred to as pipe shaped) P-BiCS NAND string 180 requires a slit trench 86A between the select gates 61 and the wings or arms of the U-shaped channel 1 which extends between upper source line 102 and bit line 202. Furthermore, as shown in FIG. 2B, adjacent U-shaped NAND strings 180 are also separated by a word line cut or trench 86B not to lose active holes and to reduce word line $R_s$. The top view of the filled memory holes 84 (i.e., containing the NAND string channels 1 and a film 13 comprising tunnel dielectric, charge storage region and blocking dielectric) and the trenches 86 in TCAT and P-BiCS devices is illustrated in FIG. 2C. The control gates are omitted from FIG. 2C for clarity and the supporting columns 88 which prevent the device levels from collapsing on each other during removal of sacrificial material are shown in the bottom of the figure. The trenches result in a higher than desired pitch between adjacent filled memory holes (e.g., a pitch of about 150 nm) and reduces the array efficiency by more than 50%.

The present inventors have realized that the word line (i.e., control gate) trenches or cuts 86 in an array of vertical NAND strings may be eliminated to increase the device density and reduce the filled memory hole 84 pitch. Embodiments include monolithic three dimensional NAND strings and methods of making three dimensional NAND devices having at least one 3×3 array of vertical NAND strings in which the control gate electrodes are continuous in the array and do not have an air gap or a dielectric filled trench 86 in the array. The NAND device is formed by first forming a lower select gate level having separated lower select gates, then forming plural memory device levels containing a plurality of NAND string portions, and then forming an upper select gate level over the memory device levels having separated upper select gates.

Figure 3A:
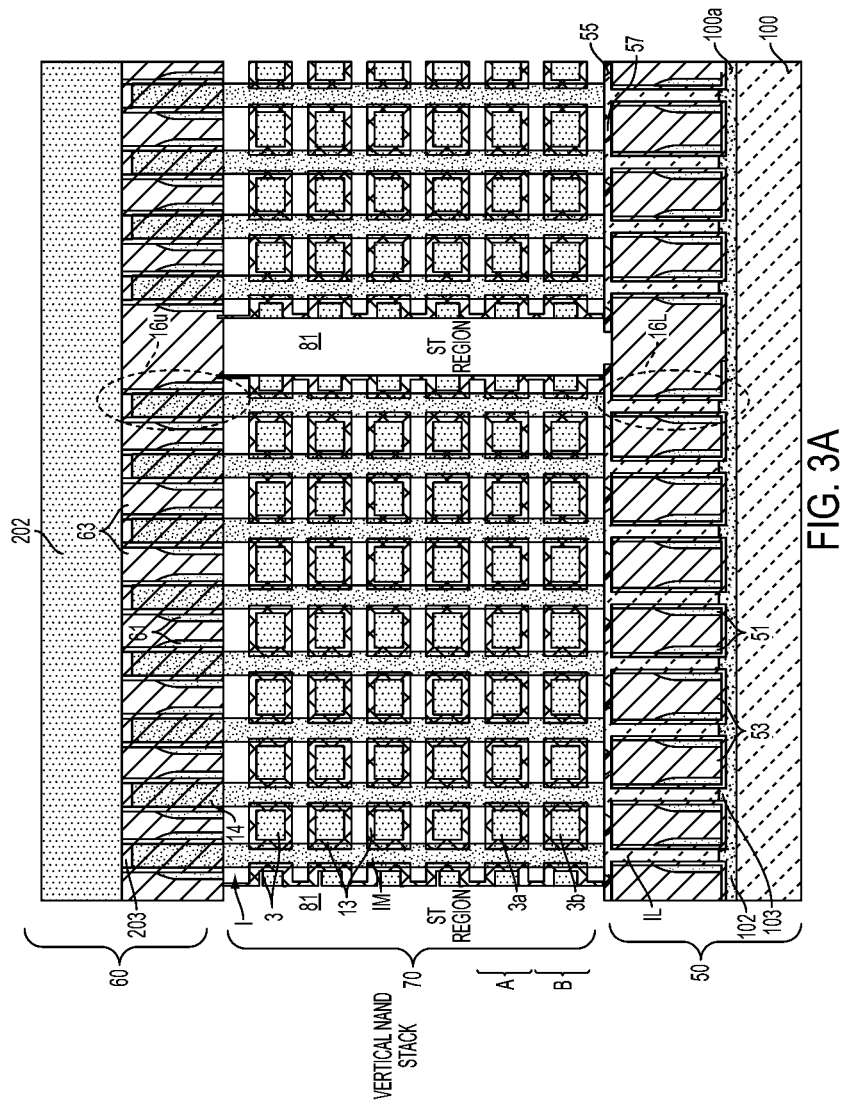
FIGS. 3A and 3B are side cross sectional views of a NAND memory device of an embodiment of the invention.
Figure 3B:
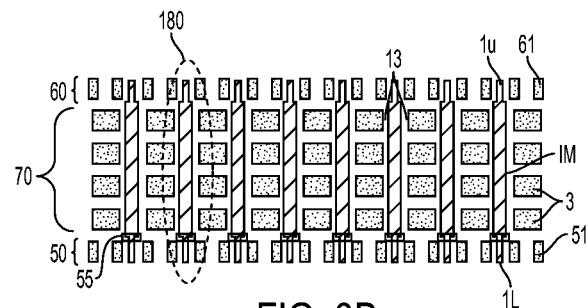
Figure 3C:
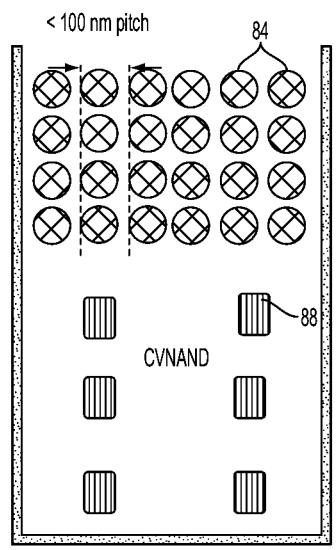
FIG. 3C is a top cross sectional view of the device of FIGS. 3A and 3B.
Figure 4A:
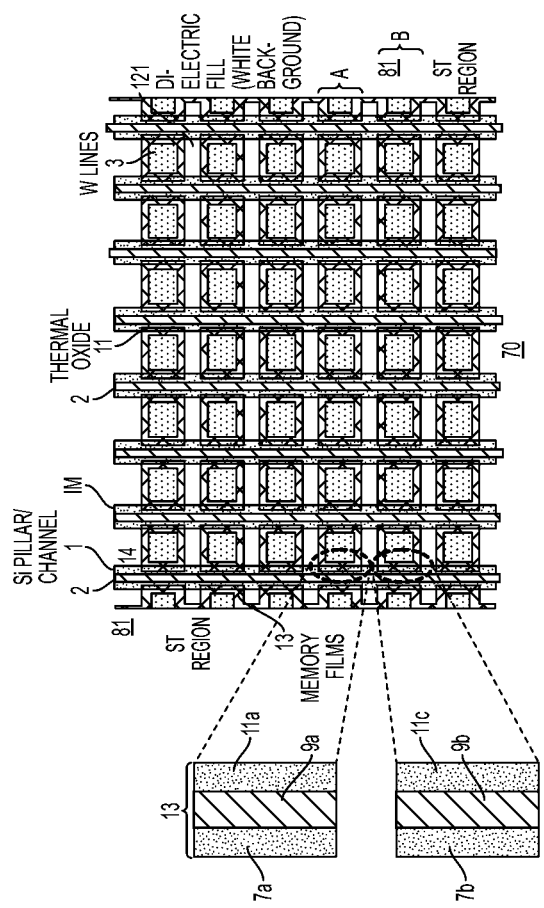
FIG. 4A is a side cross sectional views of a NAND memory device of an embodiment of the invention.
Figure 4B:
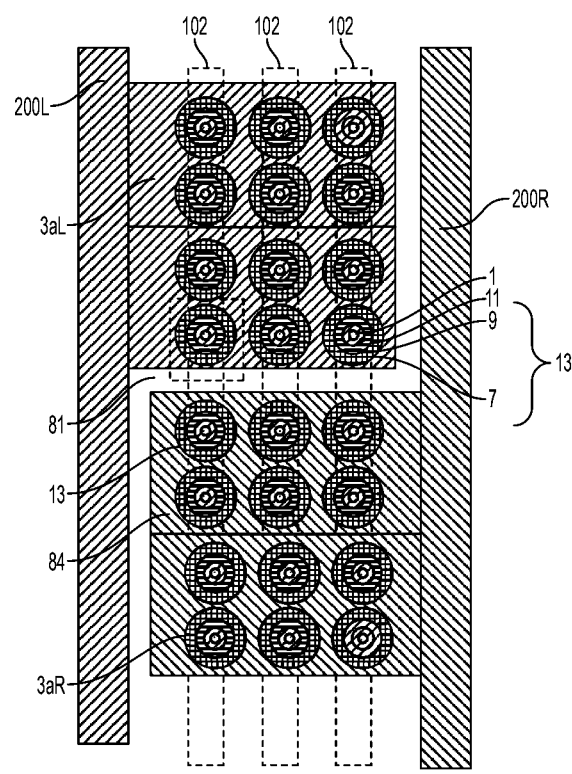
FIG. 4B is a top cross sectional view of the device of FIG. 4A.

Embodiments of the compact vertical NAND ("CVNAND") device are shown in FIGS. 3A, 3B, 3C, 4A and 4B. FIG. 3A schematically illustrates a side cross sectional view of the entire CVNAND device, including the lower 50 and upper 60 select gate device levels located below and above the memory device levels 70 shown in FIG. 4A. FIG. 3B schematically illustrates a side cross sectional view of the memory levels 70 and select gate device levels 50, 60 of one CVNAND array and FIG. 3C schematically illustrates the top view location of the filled memory holes 84 and supporting pillars 88. FIG. 4A illustrates a side cross sectional view of the memory device levels 70 (i.e., levels containing the control gate electrodes/word lines) in one NAND string array. FIG. 4B schematically illustrates the top cross sectional view of the relationship between the continuous control gate electrodes 3 and the filled memory holes 84 in each array block.

In an embodiment, the NAND string may be formed with a vertical channel. In one aspect, the vertical channel 1 has a solid, rod shape as shown in FIGS. 3B, 3A and 4B. In this aspect, the entire channel comprises a semiconductor material. In another aspect, the vertical channel has a hollow cylinder shape as shown in FIG. 4A. In this aspect, the vertical channel includes a non-semiconductor core 2 surrounded by a semiconductor channel 1 shell. The core may be unfilled or filled with an insulating material, such as silicon oxide or silicon nitride.

In some embodiments, the monolithic three dimensional NAND string 180 comprises a semiconductor channel 1 having at least one end portion extending substantially perpendicular to a major surface 100a of a substrate 100, as shown in FIGS. 3A and 3B. For example, the semiconductor channel 1 may have a pillar shape and the entire pillar-shaped semiconductor channel extends substantially perpendicularly to the major surface 100a of the substrate 100. In these embodiments, the source/drain electrodes of the device can include a lower electrode 102 (e.g., a heavily doped semiconductor region source electrode in the major surface 100a of a semiconductor substrate 100) provided below the semiconductor channel 1 in contact with a doped source region 103, and an upper electrode 202 (e.g., bit line) formed over the doped drain region 203 in the semiconductor channel 1, as shown in FIG. 3A. The lower electrode 102 contacts a metal interconnect outside of the view shown in FIG. 3A or contacts metal wires of circuitry under the array. Thus, the drain/bit line electrode 202 contacts the pillar-shaped semiconductor channel 1 (via the drain region 203) from above, and the source electrode 102 contacts the pillar-shaped semiconductor channel 1 (via source region 103) from below.

The substrate 100 can be any semiconducting substrate known in the art, such as monocrystalline silicon, IV-IV compounds such as silicon-germanium or silicon-germanium-carbon, III-V compounds, II-VI compounds, epitaxial layers over such substrates, or any other semiconducting or non-semiconducting material, such as silicon oxide, glass, plastic, metal or ceramic substrate. The substrate 100 may include integrated circuits fabricated thereon, such as driver circuits for a memory device.

Any suitable semiconductor materials can be used for semiconductor channel 1, for example silicon, germanium, silicon germanium, indium antimonide, or other compound semiconductor materials, such as III-V or II-VI semiconductor materials. The semiconductor material may be amorphous, polycrystalline or single crystal. The semiconductor channel material may be formed by any suitable deposition methods. For example, in one embodiment, the semiconductor channel material is deposited by low pressure chemical vapor deposition (LPCVD). In some other embodiments, the semiconductor channel material may be a recyrstallized polycrystalline semiconductor material formed by recrystallizing an initially deposited amorphous semiconductor material.

The insulating fill material 2 in FIG. 4A may comprise any electrically insulating material, such as silicon oxide, silicon nitride, silicon oxynitride, or other insulating materials.

Each monolithic three dimensional NAND string 180 further comprises a plurality of control gate electrodes 3, as shown in FIGS. 4A-4B. The control gate electrodes 3 may comprise a portion having a strip shape extending substantially parallel to the major surface 100a of the substrate 100. As shown in FIG. 4B, the control gate electrodes 3 when viewed from the top comprise a "mesh" which is continuous except for the memory holes 84 which are completed filled with the channel 1, an optionally the tunnel dielectric 11, charge storage region 9, blocking dielectric 7 and optional insulating fill 2. In other words, the control gate electrodes 3 may be considered to be a mesh in which all openings are filled.

The plurality of control gate electrodes 3 comprise at least a first control gate electrode 3a located in a first device level (e.g., device level A) and a second control gate electrode 3b located in a second device level (e.g., device level B) located over the major surface 100a of the substrate 100 and below the device level A, as shown in FIGS. 4A and 3A. The control gate material may comprise any one or more suitable conductive or semiconductor control gate material known in the art, such as doped polysilicon or a metal, such as tungsten, copper, aluminum, tantalum, titanium, cobalt, titanium nitride or alloys thereof. For example, in some embodiments, tungsten is preferred to allow easy processing using the "gate last" process described below with respect to FIGS. 7-10.

As shown in FIGS. 3A, 4A and 4B the first control gate electrode 3a and the second control gate electrode 3b are continuous in the array, such that these electrodes do not have an air gap or a dielectric filled trench in the array. FIG. 4B shows two control gate electrodes 3aL and 3aR (i.e., left and right electrodes) located in the first device level A. Each electrode forms a continuous mesh around an exemplary 4×3 array of filled memory holes 84. Each electrode 3aL and 3aR contacts a respective word line 200L and 200R of an array block. An array block includes plural arrays (e.g., plural 4×3 arrays) which are connected by their respective control gate electrodes (e.g., 3aL) to a common word line (e.g., 200L). Only one array is shown as being connected to each word line via a respective control gate electrode in FIG. 4B for clarity. However, it should be understood that the pattern shown in FIG. 4B repeats along the word lines. Thus, each array is located in a respective array block, where the left control gate electrode 3aL in one block in device level A is separated from the right control gate electrode 3aR in the same level A in an adjacent array block by an air gap (if the slit trench 81 is not filled) or a dielectric filled trench 81. The same configuration is used in the other memory levels shown in FIGS. 4A and 3A.

A blocking dielectric 7 is located adjacent to and may be surrounded by the control gate(s) 3. The blocking dielectric 7 may comprise a plurality of blocking dielectric segments located in contact with a respective one of the plurality of control gate electrodes 3, as shown in FIGS. 4A, 3A and 4B. For example, a first dielectric segment 7a located in device level A and a second dielectric segment 7b located in device level B are in contact with control electrodes 3a and 3b, respectively, as shown in FIG. 4A. In some embodiments, at least a portion of each of the plurality of blocking dielectric segments 7 surrounds the top, bottom, and two edge portions of a control gate electrode 3 between two adjacent NAND strings, as shown in FIGS. 4A and 3A.

The device also comprises a plurality of charge storage regions 9 located between the channel 1 and the blocking dielectric 7. Similarly, the plurality of discrete charge storage regions 9 comprise at least a first discrete charge storage segment 9a located in the device level A and a second discrete charge storage segment 9b located in the device level B, as shown in FIG. 4A.

The tunnel dielectric 11 is located between each one of the plurality of the charge storage regions 9 and the semiconductor channel 1. The blocking dielectric 7 and the tunnel dielectric 11 may be independently selected from any one or more same or different electrically insulating materials, such as silicon oxide, silicon nitride, silicon oxynitride, or other insulating materials.

The charge storage regions 9 may comprise a conductive (e.g., metal or metal alloy such as titanium, platinum, ruthenium, titanium nitride, hafnium nitride, tantalum nitride, zirconium nitride, or a metal silicide such as titanium silicide, nickel silicide, cobalt silicide, or a combination thereof) or semiconductor (e.g., polysilicon) floating gate, conductive nanoparticles, or a charge storage dielectric layer or segment (e.g., silicon nitride or another dielectric). For example, in some embodiments, the charge storage regions comprise silicon nitride, where the silicon oxide blocking dielectric 7, the nitride charge storage region 9 and the silicon oxide tunnel dielectric 11 form oxide-nitride-oxide (ONO) memory film 13 of the NAND string. Alternatively, the blocking dielectric may comprises a tri-layer ONO dielectric, such that the memory film 13 comprises ONO(11)-N(9)-O(7).

As shown in FIG. 4B, the tunnel dielectric 11 comprises a cylinder which surrounds the semiconductor channel 1, the charge storage region 9 comprises a cylinder which surrounds the tunnel dielectric, and the blocking dielectric 7 comprises a cylinder which surrounds the charge storage region. The first 3a and the second 3b control gate electrodes 3 surround the blocking dielectric in each NAND string.

The NAND string's select or access transistors 16L, 16U are shown in FIGS. 3A, 3B, 5, 6 and 11. These transistors and their operation are described U.S. patent application Ser. No. 12/827,947, which is incorporated by reference for a teaching of the select transistors.

As shown in FIGS. 3A and 5A-5C, a lower select gate electrode 51 is located adjacent to a lower portion 1L of the pillar-shaped semiconductor channel 1 below the control gate electrodes 3 (e.g., 3a, 3b) in the lower select gate electrode level 50. Level 50 may be a source select gate level and electrode 51 may be a source side select gate electrode. Each lower select gate electrode 51 is separated from adjacent lower select gate electrodes 51 in the array in level 50 by an air gap or a dielectric filled trench 53.

Furthermore, as shown in FIGS. 3A and 11A-C, an upper select gate electrode 61 is located adjacent to an upper portion 1U of the pillar-shaped semiconductor channel 1 above the first 3a and the second 3b control gate electrodes. Electrode 61 may comprise a drain side select gate electrode located in the drain upper select gate level 60. Each upper select gate electrode 61 is separated from adjacent upper select gate electrodes 61 in the array in level 60 by an air gap or a dielectric filled trench 63.

In one non-limiting embodiment, each semiconductor channel 1 comprises a first portion 1U adjacent to the upper select gate electrode 61, a second portion 1L adjacent to the lower select gate electrode 51, a third (i.e., middle or memory) portion 1M located at least in the first (A) and the second (B) device levels between the first and the second portions, and an optional landing pad portion 55 located between the second 1L and the third 1M channel 1 portions.

In one embodiment shown in FIG. 3B, the third (middle) portion 1M of the channel 1 has a larger diameter or width than the first (upper) 1U and the second (lower) 1L channel 1 portions because these three portions are formed in separate process steps as described below. The thinner upper 1U and lower 1L channel 1 portions allow the space for the air gap or a dielectric filled trench 53, 63 to be added between adjacent upper 61 and lower 51 select gates in respective levels 60 and 50. In contrast, since the control gates 3 are continuous and do not require air gap or trench adjacent to the middle (memory) portions 1M of the channel 1, the channel portions 1M may be thicker than channel portions 1U and 1L.

Finally, as shown in FIGS. 3A, 3B, 5 and 6 and as will be explained in more detail below, the channel 1 may optionally contain a landing pad portion 55. The landing pad portion has a larger diameter or width than the second 1L and the third 1M portions of the channel 1.

FIGS. 5A-5C illustrate a lower select gate level 50 of the device. FIG. 5C shows a top view and FIGS. 5A and 5B illustrate side cross sectional views along lines A-A' and B-B' in FIG. 5C. The lower select gate level 50 is located over the substrate 100. The lower select gate level 50 includes the lower portions 1L of the plurality of semiconductor channels 1 (containing source regions 103 on the bottom), and a plurality of lower source electrodes 102. Each lower source electrode is electrically connected to each of the plurality of lower portions 1L of the semiconductor channels through a respective source region 103. Level 50 also includes the plurality of lower select gate electrodes 51, located adjacent to a gate dielectric 54 contacting the lower portion 1L of each semiconductor channel 1. The channel 1L, gate dielectric 54 and select gate 51 form the lower (source) select transistor 16L of each NAND string. Strip shaped lower select gate lines 52 connect the select gates 51 in rows to input/outputs (not shown), as shown in FIGS. 5B and 5C. Level 50 is formed before the layers of the memory level 70 are formed over level 50 to allow the select gates 50 to be separated.

FIGS. 6A-6D illustrate steps in forming this level 50 shown in FIG. 5A. As shown in FIG. 6A, the lower portions 1L of the channel 1 may be formed by etching a silicon substrate 100 to form silicon pillars 1L using any suitable lithography and etching technique. Alternatively, pillars 1L may be grown in openings in a mask located over the substrate 100. In this case, the select gate device level 50 is lifted up over the substrate 100 surface 100a, so that the select transistors 16L have polysilicon channels 1L and CMOS devices may be formed in single crystal silicon substrate 100 under the NAND array. This option is less preferred.

This is followed by oxidizing the pillars 1L to form a silicon oxide gate dielectric 54 on pillar sidewall(s) and on exposed portion of substrate 100 surface 100a. Alternatively, the gate dielectric may be deposited on the pillars 1L and the surface 100A of the substrate 100 by CVD or other suitable methods. In this case, the dielectric 54 may comprise materials other than silicon oxide.

Finally, the upper surface 100A of the substrate 100 is doped (e.g., by ion implantation) to form the source regions 103 and the source electrode 102 (i.e., buried doped source line in substrate 100). The buried source line 102 in the substrate 100 is made by a high dose implant. Alternatively, an optional a buried metal mesh (e.g., tungsten, etc.) may be provided in addition to or instead of the buried implanted lines 102 as the source electrode(s). Source regions 103 may be formed by angled ion implantation (e.g., phosphorus or arsenic implant into a p-type silicon substrate) into the base of the pillars 1L. The implantation may be conducted before or after the dielectric 54 formation or after the select gate 51 formation as it is described below.

Next, as shown in FIG. 6B, during a step of forming the lower select gate level 50, each lower select gate electrode 51 is separated from adjacent lower select gate electrodes in the array by an air gap or a dielectric filled trench 53. This may be done by forming the select gate 51 layer over the dielectric 54 covered lower portions 1L of the channel 1 followed by anisotripically etching the select gate layer to leave discreet, separated sidewall spacer shaped select gates 51 on the gate dielectric 54 covered lower portions 1L of the channel. The space between the spacer gates 51 may be left as an air gap or filled with an dielectric fill 53. Alternatively, select gates 51 may be formed by depositing a conductive layer and patterning it by lithography and etching into discreet gates 51. If desired, portions of the gates 51 of transistors 16L may be silicided.

The select gate lines 52 are then formed to connect the discreet select gates into rows. The lines 52 may be formed by depositing one or more conductive layers and then performing lithography and etching to form the strip shaped lines 52. The lines 52 are separated from each other in the A-A direction but not in the B-B direction in FIG. 5C.

Then, as shown in FIGS. 6C-6D, the optional semiconductor landing pad 55 may epitaxially grown over each lower portion 1L of the plurality of semiconductor channels 1 exposed in the dielectric filled trenches 53 in the lower select gate level 50, such that the landing pad has a larger width or diameter than an underlying lower portion of the channel.

The landing pad 55 formation may comprise epitaxially growing a "mushroom head" shaped overgrown silicon 56 on exposed portions 1L of the channels 1. This silicon overgrowth 56 is then covered by an insulating gap fill layer (e.g., silicon oxide or nitride). The silicon mushroom head 56 and the gap fill layer are then planarized (e.g., by CMP) to form planar landing pads 55 on each pillar 1L separated by an insulating gap fill 57, as shown in FIG. 6D.

FIGS. 7-10 illustrate a method of making the memory device levels 70 of FIGS. 4A and 3A after the step of forming a lower select gate level 50 according to an embodiment of the invention. The memory device levels 70 comprise a plurality of NAND string portions.

Referring to FIG. 7, a stack 120 of alternating layers 121 (121a, 121b, etc.) and 132 (132a, 132b etc.) is formed over the completed lower select gate device level 50 which is located over major surface of the substrate 100. Layers 121, 132 may be deposited over the substrate by any suitable deposition method, such as sputtering, CVD, PECVD, MBE, etc. The layers 121, 132 may be 6 to 100 nm thick. The stack 120 may be covered with an optional cap layer of insulating material 200 different from materials 121 and 132.

In this embodiment, the first layers 121 comprise an electrically insulating material, such as silicon oxide, silicon nitride, high-k dielectric (e.g., organic or inorganic metal oxide), etc. The second layers 132 are sacrificial layers. Any sacrificial material that can be selectively etched compared to material 121 may be used for layers 132, such as conductive or insulating or semiconducting material. For example, the sacrificial material for layers 132 may be silicon nitride when material of layers 121 is silicon oxide.

The deposition of layers 121, 132 is followed by etching the stack 120 to form a plurality of memory holes 84. An at least a 3×3, such as an at least 6×6 array of memory holes 84 may be formed in locations where vertical channels of NAND strings will be subsequently formed.

The middle semiconductor channel 1 portions 1M are then formed on the landing pads 55 exposed in the memory holes 84. The channel portions 1M may be filled with insulating fill 2 (as shown in FIG. 4A) or may comprise a solid rod (as shown in FIGS. 3A and 7).

Preferably, the channel 1 portions 1M material comprises lightly doped p-type or n-type (i.e., doping below $10^{17}$ cm$^{-3}$) silicon material (e.g., polysilicon). An n-channel device is preferred since it is easily connected with n+ junctions (i.e., source 103 and drain 203 n+ doped regions having a doping concentration between $10^{17}$ cm$^{-3}$ and $10^{21}$ cm$^{-3}$). However, a p-channel device may also be used. Other semiconductor materials (e.g., SiGe, SiC, Ge, III-V, II-VI, etc.) may also be used.

The semiconductor channel 1 may be formed by any desired methods. For example, the semiconductor channel material 1 may be formed by depositing semiconductor (e.g., polysilicon) material in the holes 84 and over the stack 120 (e.g., by CVD), followed by a step of removing the upper portion of the deposited semiconductor layer by chemical mechanical polishing (CMP) or etchback using top surface of the stack 120 as a polish stop or etch stop.

In some embodiments, a single crystal silicon or polysilicon vertical channel 1 may be formed by metal induced crystallization ("MIC", also referred to as metal induced lateral crystallization) without a separate masking step. The MIC method provides full channel crystallization due to lateral confinement of the channel material in the hole 84.

In the MIC method, an amorphous or small grain polysilicon semiconductor (e.g., silicon) layer can be first formed in the holes 84 and over the stack 120, followed by forming a nucleation promoter layer over the semiconductor layer. The nucleation promoter layer may be a continuous layer or a plurality of discontinuous regions. The nucleation promoter layer may comprise any desired polysilicon nucleation promoter materials, for example but not limited to nucleation promoter materials such as Ge, Ni, Pd, Al or a combination thereof.

The amorphous or small grain semiconductor layer can then be converted to a large grain polycrystalline or single crystalline semiconductor layer by recrystallizing the amorphous or small grain polycrystalline semiconductor. The recrystallization may be conducted by a low temperature (e.g., 300 to 600 C) anneal.

The upper portion of the polycrystalline semiconductor layer and the nucleation promoter layer can then be removed by CMP or etchback using top surface of the stack 120 as a stop, resulting in the structure as shown in FIG. 7. The removal may be conducted by selectively wet etching the remaining nucleation promoter layer and any formed silicide in the top of layer following by CMP of the top of silicon layer using the top of the stack 120 as a stop.

Following formation of the channel 1 portions 1M, at least one slit trench 81 (also shown in FIG. 4B) is formed in the stack 120. The openings 81, 84 may be formed by forming a mask (e.g., a photoresist mask) by photolithography followed by etching unmasked areas. The slit trench opening 81 may be in the shape of a cut traversing more than one NAND string as illustrated in FIG. 4B. The slit trenches 81 allow back side access to the vertical NAND strings located in memory holes 84 for the control gate 3 formation in the "gate last" process.

Next, as shown in FIG. 8, the sacrificial material 132 is selectively etched compared to the first layer 121 material to form recesses 62. The recesses 62 may be formed by selective, isotropic wet or dry etching which selectively etches the sacrificial material 132 compared to the first layer insulating material 121 through the slit trenches 81. The recess 62 extends to the channel 1 portions 1M. Preferably, the entire layers of first sacrificial material 132 between the first layers 121 are removed up to the channel 1 portions 1M.

The memory film 13 is then formed in the recesses 62 as shown in FIG. 9. This includes forming a tunnel dielectric 11 in the recesses over the channel portions 1M located in the memory openings 84, forming a charge storage region 9 over the tunnel dielectric, and forming a blocking dielectric 7 over the charge storage region in the recesses 62. The blocking dielectric 7 may comprise a silicon oxide layer deposited by conformal atomic layer deposition (ALD) or chemical vapor deposition (CVD). Other high-k dielectric materials, such as hafnium oxide, may be used instead or in addition to silicon oxide. Dielectric 7 may have a thickness of 6 to 20 nm. The charge storage region 9 may comprise a silicon nitride layer deposited by any suitable method, such as ALD, CVD, etc., and have a thickness of 3 to 20 nm. The tunnel dielectric may comprise a relatively thin insulating layer (e.g., 4 to 10 nm thick) of silicon oxide or other suitable material, such as oxynitride, oxide and nitride multi layer stacks, or a high-k dielectric (e.g., hafnium oxide). The tunnel dielectric may be deposited by any suitable method, such as ALD, CVD, etc. Alternatively, the tunnel dielectric may be formed by thermally oxidizing the exposed sidewalls of the middle portions 1M of the channel 1 exposed in the recesses 62.

The control gates 3 are then formed on the blocking dielectric in the remaining portions of the recesses 62 through the slit trench(es) 81, as shown in FIG. 10. The control gates 3 are preferably metal or metal alloy gates, such as tungsten gates, formed by MOCVD or other suitable methods. Finally, if desired, the slit trenches 81 between array blocks may be filled with a dielectric fill material or they may be left unfilled as air gap trenches.

FIGS. 11A-11C illustrate the upper select gate level 60 of the device. FIG. 11C shows a top cross sectional view (along lines A-A and B-B in FIGS. 11A and 11B, respectively, with bit line 202 not shown) and FIGS. 11A and 11B illustrate side cross sectional views along lines A-A' and B-B' in FIG. 11C. The upper select gate level 60 is formed over the plurality of memory device levels 70, preferably after levels 70 are completed and preferably without using the stack 120 layers. The upper select gate level 60 comprises upper portions 1U of the plurality of semiconductor channels 1, and a plurality of upper drain electrodes (e.g., bit lines) 202. Each upper source or drain electrode 202 is electrically connected to each of the plurality of upper portions 1U of the semiconductor channels via the drain regions 203. Level 60 also includes a plurality of upper select gate electrodes 61. Each upper select gate electrode 61 is located adjacent to a gate dielectric 64 contacting the upper portion 1U of each semiconductor channel 1. The channel portion 1U, gate dielectric 64 and select gate 61 form the upper (drain) select transistor 16U of each NAND string. The upper select gate lines 66 separated from each other by insulating fill 63 connect the select gates 61 in rows.

The upper select gate level 60 may be formed in the same manner as the lower select gate level 50, except as follows. First, the upper portions 1U (i.e., the channels of the upper select gate transistors 16U) of the channels 1 are grown on the respective middle portions 1M of the channels. Thus, portion 1U may comprise polycrystalline semiconductor (e.g., polysilicon) or recrystallized, nearly single crystal silicon (e.g., recrystallized by the MIC process).

Second, rather than forming landing pads 55, the tops of the pillars 1U are doped with a dopant of the opposite conductivity type (e.g., n-type) than that of the channel 1 portion 1U (e.g., p-type) to form drain regions 203. This may be performed by ion implanting P or As into exposed portions of silicon pillars 1U. Third, as shown in FIG. 11B, the bit lines 202 are formed by a damascene process in rail shaped trenches in a dielectric layer 204 or by forming the dielectric layer 204 around bit line 202 rails. Otherwise, the upper select gate electrodes 61 may be formed by a sidewall spacer process on gate dielectric 64 covered silicon channels 1L of the upper select gate transistors 16U in the same matter as the lower select gate electrodes 51. If desired, portions of the gates 61 and/or the drain 203 of transistors 16U may be silicided.

FIGS. 12A and 12B illustrate exemplary dimensions (in nanometers) of the select transistors 16 and elements of levels 50 and 60, respectively, in units of nanometers. The above configuration provides a dense array for larger block sizes. The CVNAND scales below 5 nm effective half pitch (F/n), where F is the minimum feature size and n is the number of device levels.

The above described NAND device may be programmed and read by conventional NAND techniques. However, since the select gates for each NAND string are separated, the erase operation of the above device may be advantageously performed by a gate induced drain leakage (GIDL) process through the lower select gate source transistor 16L in the lower select gate device level 50. The effective GIDL erase allows erasing of very tall stacks by optimizing the bottom SGS transistor 16L with respect to GIDL current (during erase) and off/leakage currents (during inhibit). This also provides an effective erase from source line 102 side only, which allows optimization of off current and leakage current (during inhibit and read) for top SGD transistor 16U. This allows the device to open up an inhibit window and reduce read current leakage for non selected blocks. It is believed that sub block erase could become effective compared to prior art three dimensional NAND.

Figure 13A:
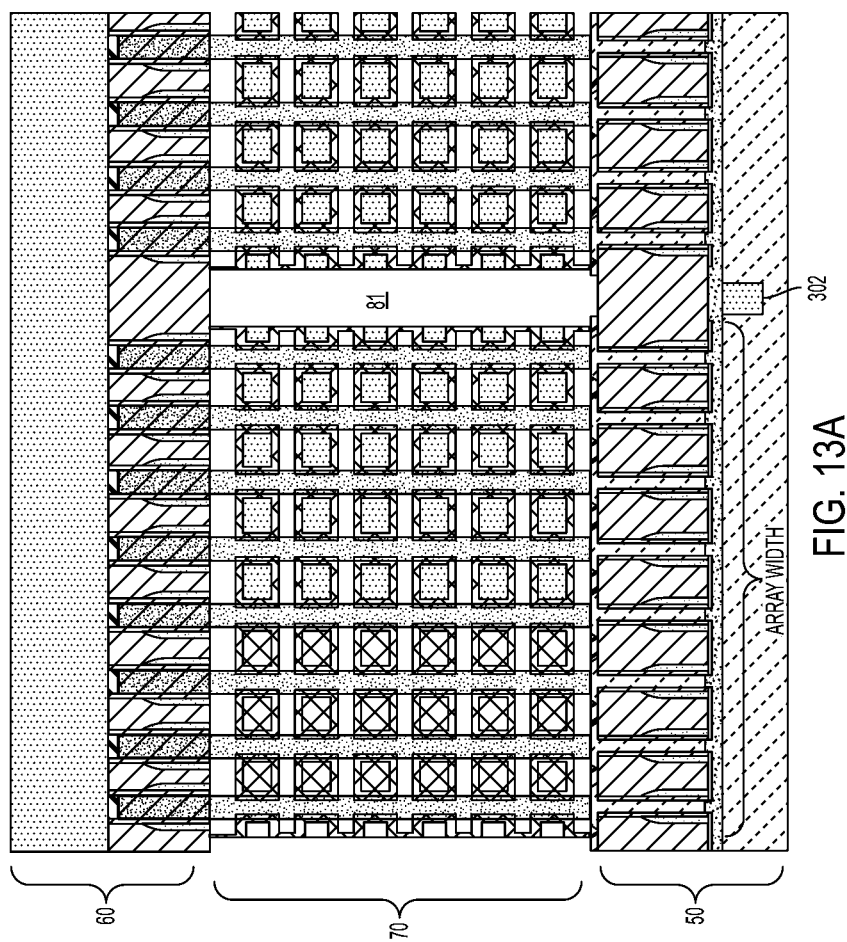
FIGS. 13A and 13B are side cross sectional views of NAND memory devices of other embodiments of the invention.
Figure 13B:
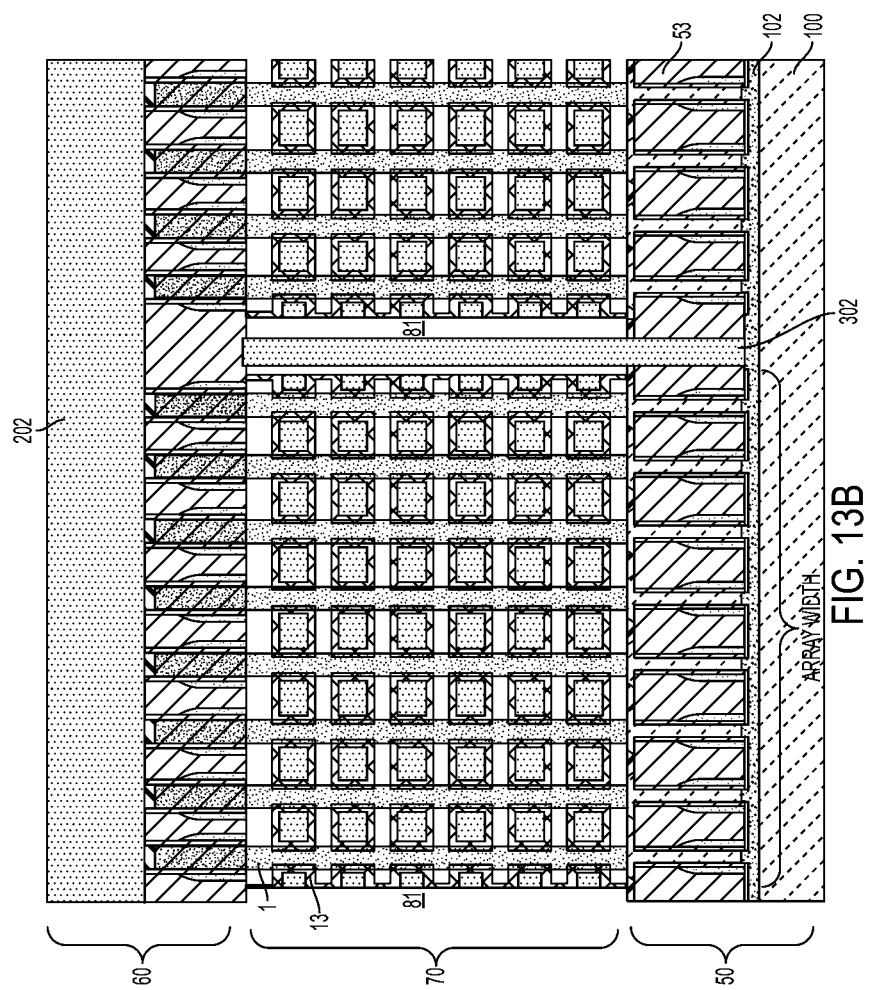

FIGS. 13A and 13B are side cross sectional views of a NAND memory device of embodiments of the invention. The devices shown in FIGS. 13A and 13B are similar to the device shown in FIG. 3A above, except that the devices shown in FIGS. 13A and 13B contain a local interconnect (source contact) 302. The local interconnect 302 may extend below the array in the embodiment of FIG. 13A (e.g., the local interconnect may extend in and out of the page under the array in the view of FIG. 13A). Alternatively, the local interconnect 302 may extend in the slit trenches 81 in the embodiment of FIG. 13B. The local interconnect 302 may comprise any suitable conductive material, such as tungsten, aluminum, copper, etc.

In the embodiment of FIG. 13B, the local interconnect 302 comprises a vertical pillar which electrically contacts the lower electrode 102 (e.g., the heavily doped semiconductor region source electrode in the major surface of the semiconductor substrate 100 or another electrode located over the substrate). The upper portion of the local interconnect 302 is in electrical contact with a source line.

In the present embodiment, the slit trenches 81 and the local interconnect 302 extend through the memory device levels 70 and through the dielectric trench fill material 53 to an exposed upper surface of the lower electrode 102. Preferably, the sidewalls of the slit trenches 81 are coated with an insulating layer 304, such as silicon oxide (see FIGS. 14D and 14E), and the local interconnect is formed in the middle of the slit trenches 81 between the insulating layer 304 portions.

As shown in FIG. 13B, the width of the array of vertical NAND strings is defined by the space between adjacent trenches 81, at least one or more of which can be filled with the local interconnect 302. The local interconnect 302 may contact a common lower electrode 102 of adjacent arrays of strings to provide source side erase for the strings in plural arrays of NAND strings at the same time.

The local interconnect may be formed by etching the trenches 81 as described above all the way to the lower electrode 102, forming the insulating layer 304 in the trenches 81 and filling the remaining central space in the trenches with the conductive material of the local interconnect 302. The portions of the conductive layer of the local interconnect 302 and/or insulating layer 304 which extends out of the trenches 81 may be removed by planarization, such as CMP. In the alternative embodiment of FIG. 13A, the local interconnect is formed under the array prior to formation of the array.

Figure 14C:
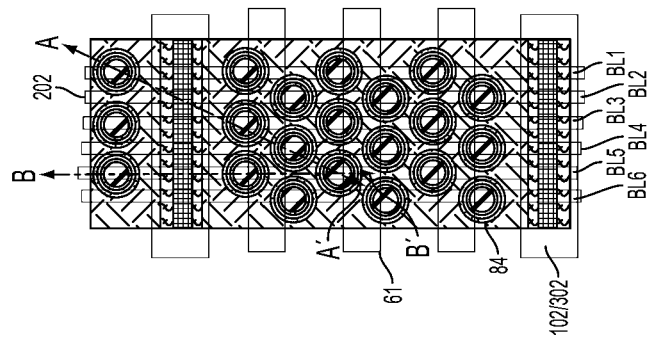
FIG. 14A is a top cross sectional view of the prior art device and FIGS. 14B and 14C are a top cross sectional views of NAND memory devices according to embodiments of the invention.
Figure 14B:
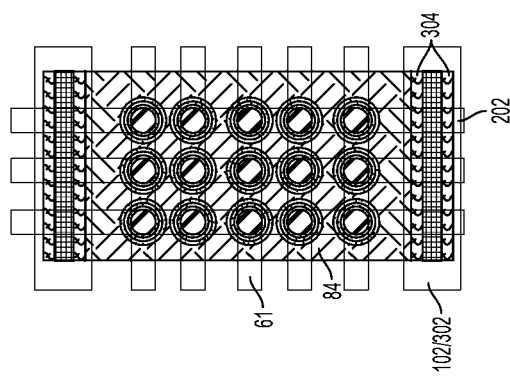
Figure 14A:
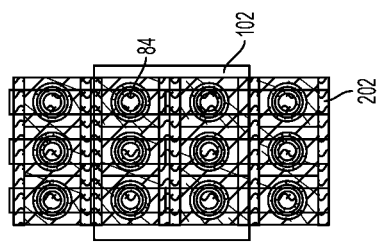

FIG. 14A is a top cross sectional view of the prior art BiCS NAND device shown in FIGS. 1B and 2B. FIGS. 14B and 14C are a top cross sectional views of the CVNAND memory devices according to embodiments of the invention.

As shown in FIG. 14B, the filled memory holes 84 (i.e., holes 84 containing the pillar channel 1 and memory film 13) are arranged in a square or rectangular layout with the memory holes located at corners of an imaginary rectangle or square, similar to the BiCS layout in FIG. 14A. The upper select gates 61, bit lines 202 and local interconnect 302 extending to the lower electrode 102 are also shown in FIG. 14B.

FIG. 14C illustrates an alternative embodiment in which the filled memory holes 84 (i.e., the NAND string channel 1 and memory film 13) are arranged in a substantially hexagonal pattern. This pattern comprises a repeating unit pattern of seven filled memory holes 84 having a central hole 84 surrounded by six other holes 84 arranged in a hexagonal layout around the central hole 84. In other words a central semiconductor channel 1 and memory film 13 unit is surrounded by six other semiconductor channel and memory film units arranged in a hexagonal layout around the central semiconductor channel and memory film unit. The hexagonal pattern has three axes of symmetry, in the same plane, about a point the array. The three axes are separated by substantially 60 degrees from one another. Hence, the memory holes 84 are arranged on a hexagonal grid which is also known as hexagonal tiling, bitruncated hexagonal tiling, or omnitruncated hexagonal tiling. Advantageously, hexagonal packing of the takes only about 87% of the area typically used by the same number of cells using standard rectangular layout shown in FIG. 14A.

The memory holes 84 in the hexagonally tiled configuration of FIG. 14C are staggered along each select gate 51, 61 when viewed from the top. The hexagonally tiled configuration of FIG. 14C provides a relaxed layout (i.e., larger pitch) for the select gates 51, 61 compared to the layout of FIGS. 14A and 14B. However, the density of the array with the hexagonally tiled configuration of FIG. 14C can be increased compared to the layout of FIGS. 14A and 14B, with the bit line 202 pitch reduced by a factor of 2 compared to the one in the layout of FIGS. 14A and 14B.

Figure 14D:
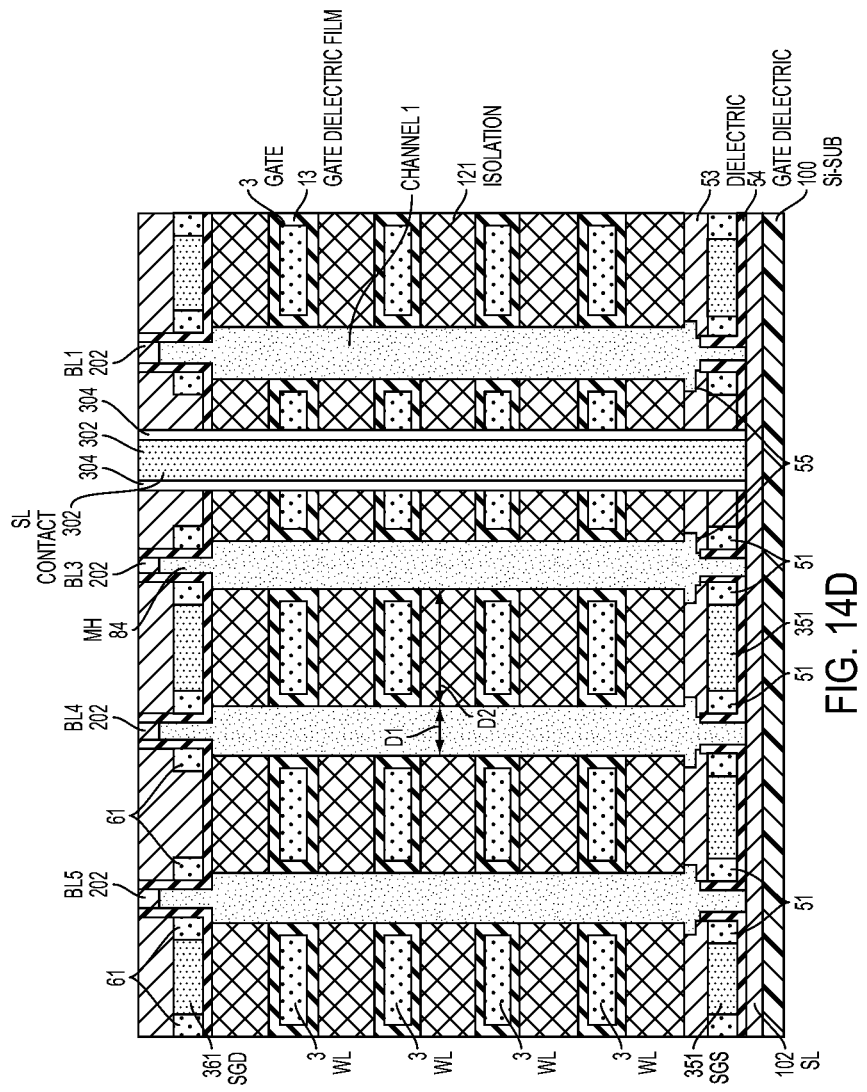
FIGS. 14D and 14E are respective side cross sectional views along lines A-A' and B-B' in FIG. 14C of a NAND memory device of an embodiment of the invention.
Figure 14E:
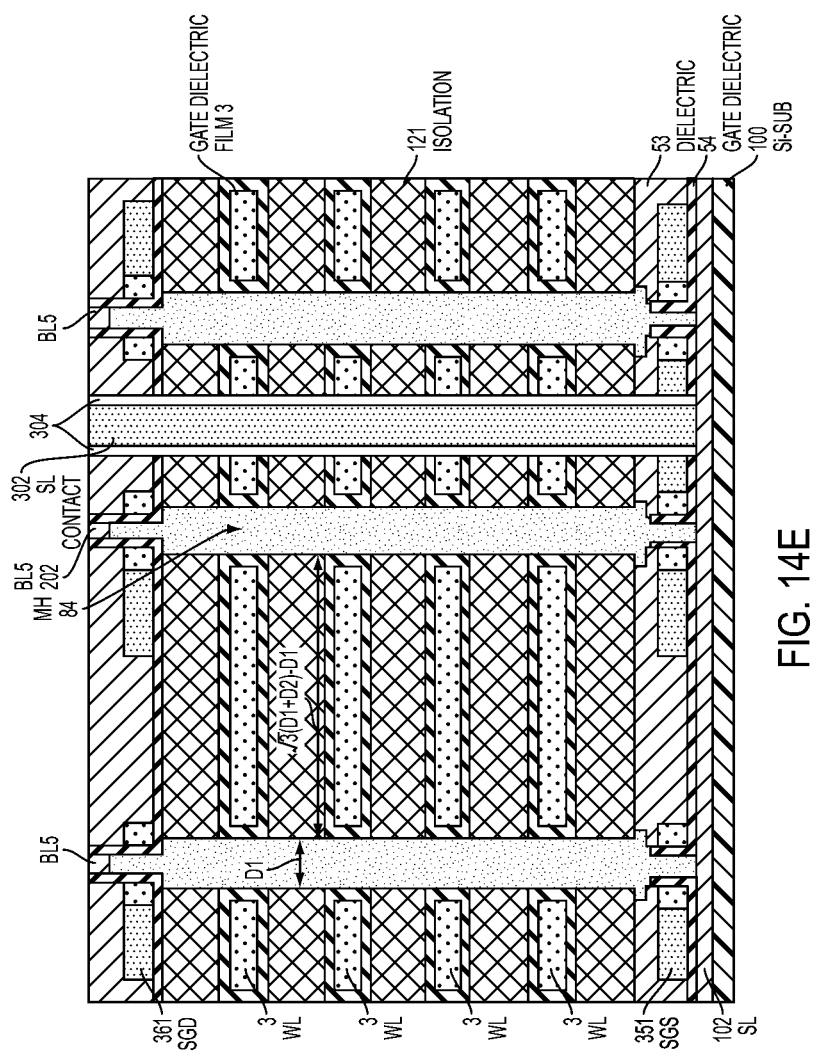

FIGS. 14D and 14E are respective side cross sectional views along lines A-A' and B-B' in FIG. 14C of the CVNAND memory device with the hexagonally tiled memory hole 84 configuration. Line A-A' is a diagonal line through filled memory holes 84 located on bit lines 1, 3, 4 and 5. Line B-B is a line along bit line 5. In the example shown in FIG. 14C, there are six bit lines (BL1, BL2, BL3, BL4, BL5 and BL6) and three select gates 61 which form a 6×3 hexagonally tiled array of eighteen NAND strings between adjacent local interconnects 302. Arrays having a configuration other than 6×3 may also be used as desired.

FIGS. 14D and 14E also illustrate the connector lines 351, 361 for the respective lower select gates 51 and upper select gates 61 of the respective SGS 16L and SGD 16U select transistors. The lines 351, 361 may comprise any suitable conductor, such as tungsten, and may connect the select gates to the driver/control circuits (not shown).

As shown in FIG. 14D, the diameter of each memory hole 84 is labeled d1 and the distance between adjacent memory holes 84 (along the diagonal line A-A' in FIG. 14C) is labeled d2. The distance between adjacent memory holes 84 (along a given bit line, BL5, along the vertical line B-B' in FIG. 14C) is $\sqrt{3}*(d1+d2)-d1$.

Figure 15A:
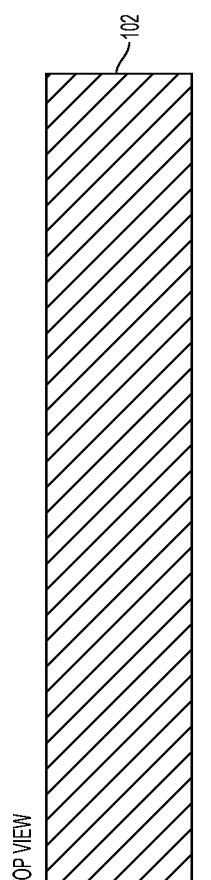
FIGS. 15A to 15Q are top views of steps in the method of making the NAND memory device shown in FIG. 14C and FIGS. 16A to 16Q are respective side cross sectional views along line B-B' in FIG. 14C of the corresponding steps in the method of making the NAND memory device shown in FIGS. 15A to 15Q.
Figure 16A:
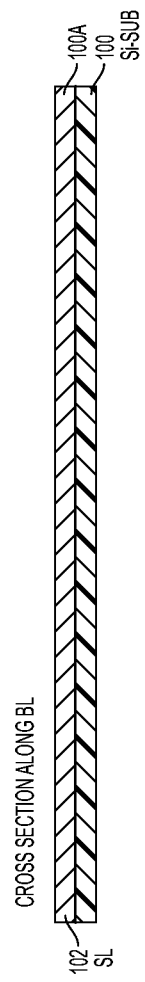
Figure 15C:
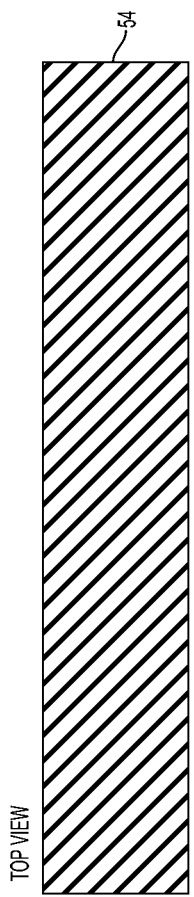
Figure 15D:
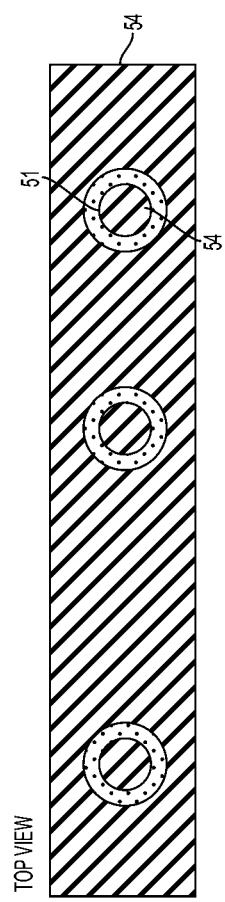
Figure 15F:
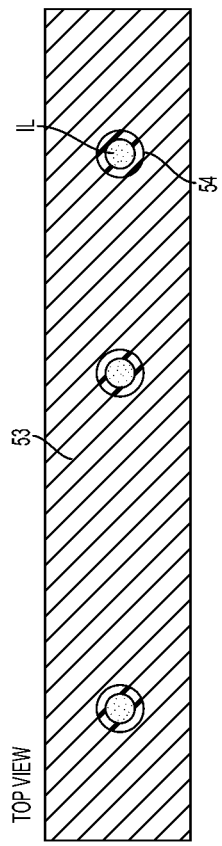
Figure 15G:
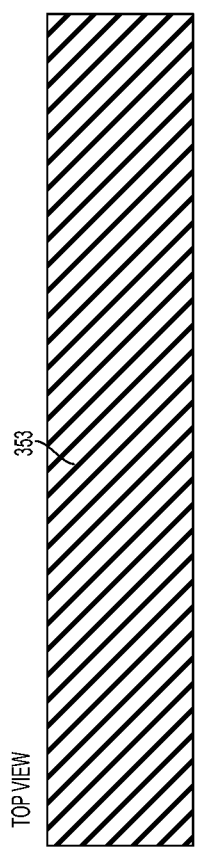
Figure 15H:
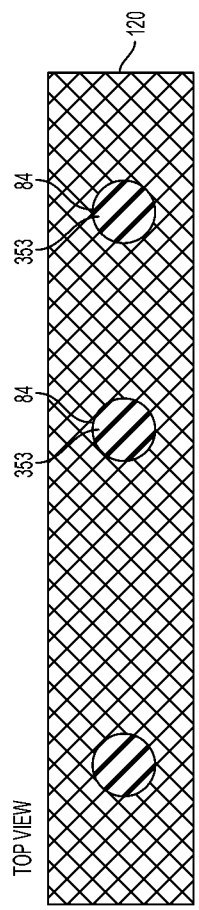
Figure 15J:
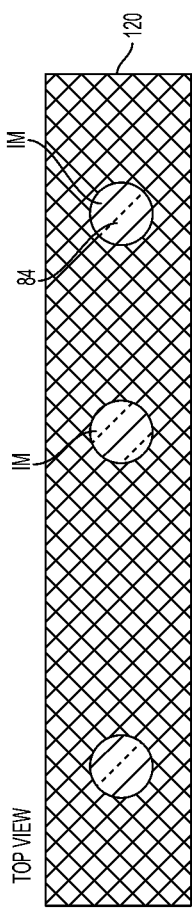
Figure 15O:
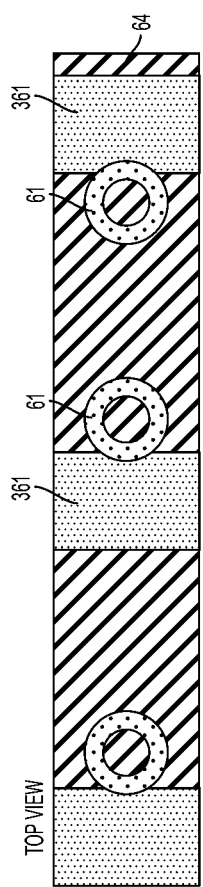
Figure 15P:
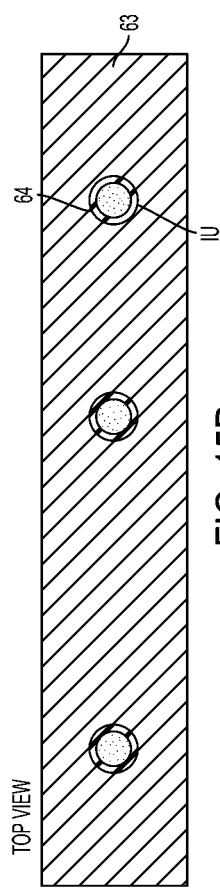
Figure 15Q:
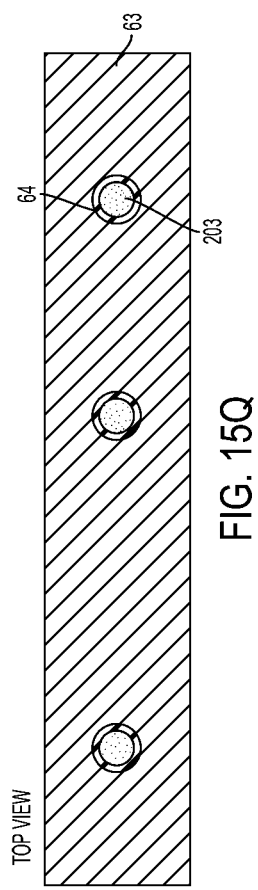

FIGS. 15A to 15Q are top views of steps in the method of making the NAND memory device shown in FIG. 14C. FIGS. 16A to 16Q are respective side cross sectional views along line B-B' in FIG. 14C of the corresponding steps in the method of making the NAND memory device shown in FIGS. 15A to 15Q.

The method begins by forming the lower electrode 102, such as by implanting a heavily doped diffusion region 102 in the upper surface 100a of the substrate 100. For example, region 102 may comprise an n+ doped region in a p-type substrate 100, as shown in FIGS. 15A and 16A. The conductivity types may be reversed if desired. Diffusion (doped) region 102 serves as a common source line of the lower select gate transistor 16L.

A plurality of pillar semiconductor channels 1L are then formed on region 102. Each channel 1L will serve as a channel of the lower select gate transistor 16L, as shown in FIGS. 15B and 16B. Channel 1L may comprise an undoped or lightly p-type doped polysilicon having a lower doping concentration than that of region 102. Channel 1L may be formed by depositing an undoped or lightly doped polysilicon layer followed by patterning this layer into the pillars 1L using photolithography and etching.

Figure 16C:
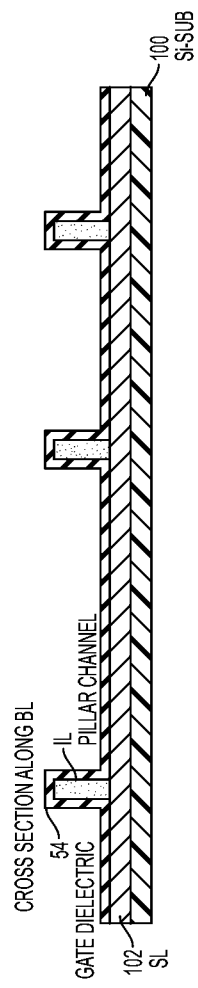

A gate dielectric 54 of the lower select gate transistor 16L is then deposited over the region 102 and on top and sidewalls of the pillar semiconductor channels 1L, as shown in FIGS. 15C and 16C. The gate dielectric 54 may comprise silicon oxide or another dielectric.

Figure 16D:
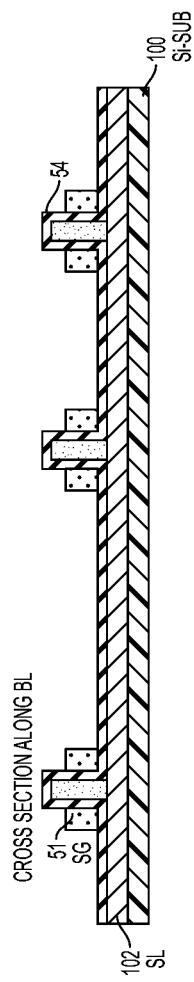
Figure 16F:
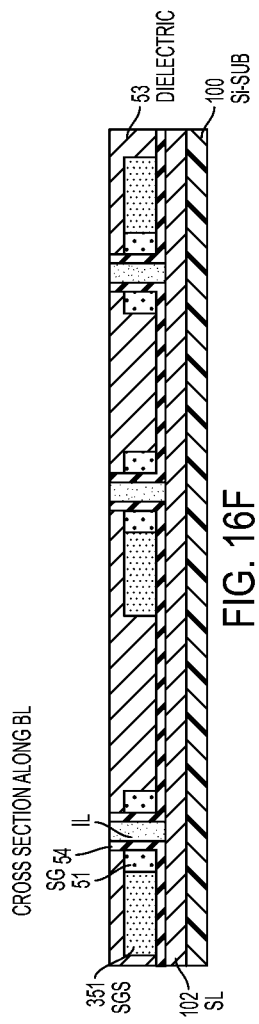

The lower select gate electrodes 51 are then formed on the sidewalls of the dielectric 54 covered pillar channels 1L, as shown in FIGS. 15D and 16D. The gate electrodes 51 may be formed by depositing the gate electrode material over the device shown in FIGS. 15C and 16C, following by an anisotropic spacer etch to form the sidewall spacer gates 51. Preferably, after forming the spacer gates 51 by the spacer etch, a second etch back etch (or a spacer over etch) is conducted such that the top of the gates 51 is located below the top of the pillar channels 1L.

Then, the SGS connector lines 351 for the respective lower select gates 51 are formed in contact with a side of the gates 51, as shown in FIGS. 15E and 16E. Lines 351 may comprise any suitable conductor, such as tungsten. Lines 351 may be formed by depositing a tungsten layer over the device shown in FIGS. 15D and 16D and then patterning the tungsten layer into the lines 351 using photolithography and etching.

In the next step, a trench fill dielectric material 53, such as silicon nitride or another insulating material different from material 54 is formed over the device shown in FIGS. 15E and 16E. The material 53 is then etched back or planarized (e.g., by CMP) to expose the top surface of the cylindrical pillar semiconductor channels 1L surrounded by the gate dielectric 54. A portion of the trench fill dielectric material 53 remains over the upper surface of the recessed select gates 51 and lines 351.

Figure 16G:
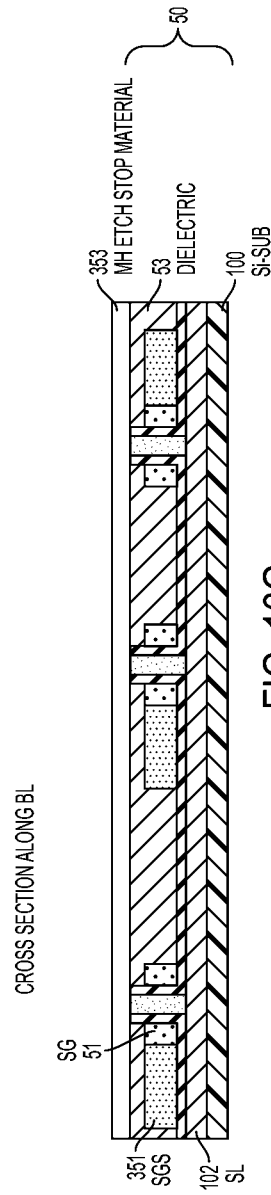

If desired, the landing pads 55 and the gap fill dielectric 57 may be formed over the exposed pillar semiconductor channels 1L, as shown in FIGS. 6C and 6D. A memory hole etch stop layer 353 is then formed over the device, as shown in FIGS. 15G and 16G. The etch stop layer 353 may comprise any suitable etch stop material, such as a metal oxide material, for example tantalum oxide or hafnium oxide. This completes the lower device level 50.

Figure 16H:
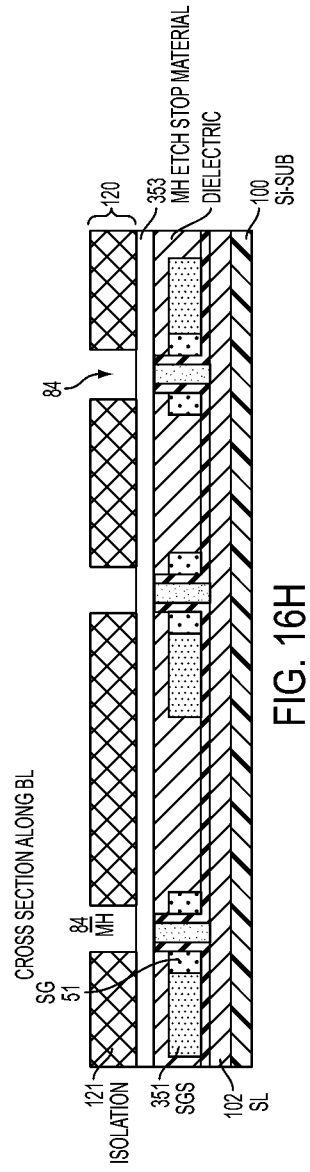

Then, as shown in FIGS. 15H and 16H, a stack 120 of alternating layers 121 (121a, 121b, etc.) and 132 (132a, 132b etc.) is formed over the etch stop layer 353 on the completed lower select gate device level 50. The stack 120 and layers 121, 132 are described above and are illustrated in FIG. 7. The stack 120 is then patterned by photolithography and etching to form the memory holes 84 extending to the etch stop layer 353, as shown in FIGS. 15H and 16H.

The etch stop layer 353 exposed in the memory holes 84 is then etched using a different etching chemistry to expose the top surface of the upper portions of the pillar semiconductor channels 1L and dielectric layer 54 and optionally dielectric layer 53, as shown in FIGS. 15I and 16I. These figures are not to scale.

Figure 16J:
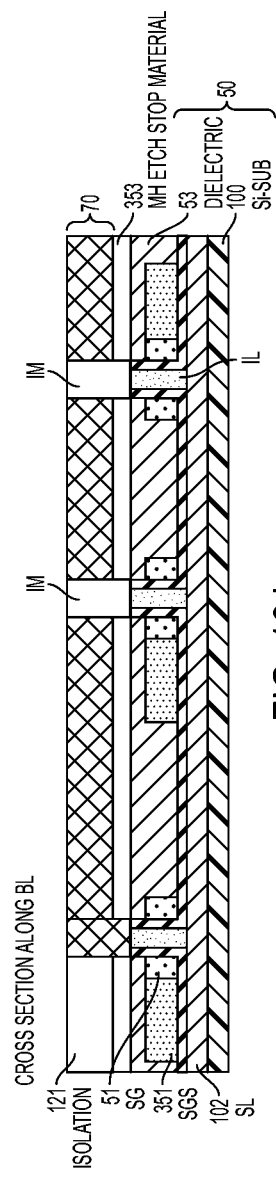

As shown in FIGS. 15J and 16J, the memory device level 70 cylindrical pillar channels 1M are then formed in the memory holes such that the channels 1M electrically contact the lower select gate transistor 16L pillar channels 1L. The pillar channels 1M may directly contact the pillar channels 1L or the pillar channels 1M may contact the landing pads 55 shown in FIG. 3B which contact the pillar channels 1L. Preferably, cylindrical pillar channels 1M have a larger diameter than cylindrical pillar channels 1L.

Then, the slit trenches 81 may be formed as shown in FIGS. 4B and 7. Layers 132 may be removed through the slit trenches 81 as shown in FIG. 8, and the memory films 13 and the control gates 3 may be formed in the stack 120 through the slit trenches 81 using the "back side process" as shown in FIGS. 9 and 10.

Alternatively, a "front side process" may be used to complete the memory device level 70. In the front side process, rather than using the sacrificial layer 132 in the stack 120, the stack 120 contains conductive control gate layers 3 separated by insulating layers 121. In this alternative method, the memory films 13 are formed inside the memory holes 84, such that a respective film 13 covers a sidewall of a respective hole 84. The channels 1M are then formed in the open middle portion of each hole 84 in contact with a respective memory film 13, as described above. Again, the control gate material may comprise any one or more suitable conductive or semiconductor control gate material known in the art, such as doped polysilicon or a metal, such as tungsten, copper, aluminum, tantalum, titanium, cobalt, titanium nitride or alloys thereof. For the semiconductor control gate case, silicidation process can be performed through the slit trenches 81 to improve the conductivity.

Finally, the insulating layer(s) 304 and the local interconnect(s) 302 are formed in the slit trench(es) 81, as shown in FIGS. 13B, 14D and 14E, and as described above. This completes the memory device level 70.

The upper select gate device level 60 is then formed using the steps shown in FIGS. 15K-15Q and 16K-16Q. First, as shown in FIGS. 15K and 16K, the upper most insulating layer 121 in the stack 120 is etched back to expose the upper portions 1U of the pillar channel 1M. As shown in FIGS. 15L and 16L, the exposed channel material can be further etched to form narrower channels 1U. Alternatively, a separate upper pillar semiconductor channels 1U may be formed on upper surfaces of the channels 1M exposed in the holes 84. Channels 1U may be formed by depositing a semiconductor layer, such as lightly doped polysilicon or undoped polysilicon layer, and patterning the layer using photolithography and etching. Preferably, channels 1U have a smaller diameter than channels 1M.

Figure 16O:
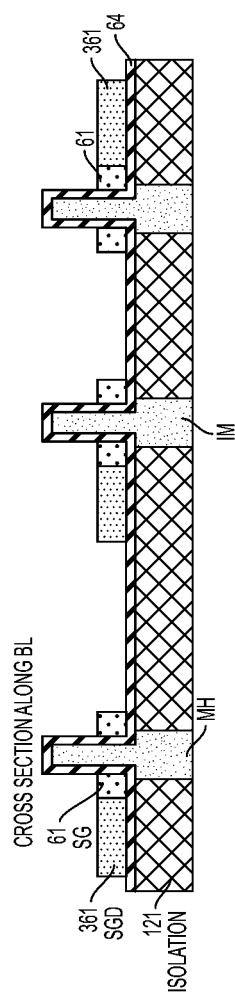

A gate dielectric 64, such as a silicon oxide layer is then formed over the pillar channels 1U, as shown in FIGS. 15M and 16M. Then, as shown in FIGS. 15N and 16N, the upper select gates 61 are formed as sidewall spacers similar to the lower select gates 51 described above. The SGD connector lines 361 for the respective upper select gates 61 are formed in contact with a side of the gates 61, as shown in FIGS. 15O and 16O, in a similar manner to the SGS connector lines 351 described above.

Figure 16P:
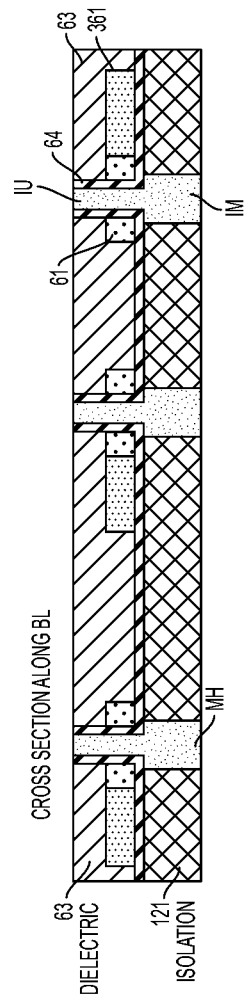
Figure 16Q:
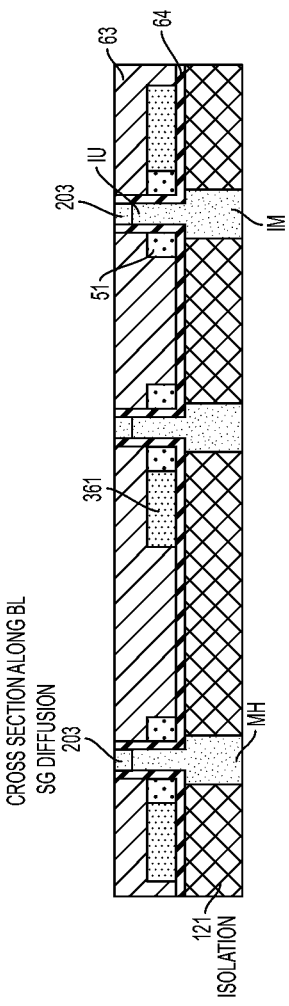

The trench fill dielectric 63, such as silicon nitride is then formed over the device and planarized, such as by CMP, to expose the upper surface of the channels 1U, as shown in FIGS. 15P and 16P. Finally, the drain regions 203 are formed in the upper portions of the channels 1U by implanting a dopant of the opposite conductivity type to that of the channel 1U, as shown in FIGS. 15Q and 16Q. For example, region 203 may be heavily n+ doped if channel 1U/1M/1L is lightly p-type doped. The upper device level 60 is completed by forming the bit lines 202 as shown in FIGS. 11A and 11B.

As described above with respect to FIGS. 15A and 16A, the buried source line/region 102 is formed by a high dose implant into the substrate. If desired, an optional buried tungsten or another metal or metal alloy mesh may be used in addition or instead of the buried doped semiconductor region. In another alternative embodiment, the polysilicon gate 51 and/or buried source region 102 of the SGS device 16L and/or the polysilicon gate 61 of the SGD device 16U may be silicided to form a metal silicide layer on the surface of the polysilicon or silicon.

In another alternative embodiment, the lower select device level 50 may be lifted up, so that SGS devices 16L become polysilicon based devices located in a polysilicon layer above an insulating layer. This allows CMOS driver circuits to be formed under the insulating layer and the NAND array.

Thus, the CVNAND of the embodiments of the invention is denser compared to BiCS and TCAT NAND devices of FIGS. 1 and 2 and provides a very dense array for larger block sizes. The CVNAND contains an upper pillar device (SGD 16U) having a polysilicon or crystallized polysilicon channel and bottom pillar device (SDS 16L) having a source electrode 102 in single crystal silicon substrate 100 or in a polysilicon layer with CMOS driver circuits in the substrate 100 under the NAND array. The pillar SGS/D devices 16L, 16U have a tight pitch in order to skip separation trenches 86 in prior art devices.

The CVNAND device can be effectively GIDL erased using the single crystal silicon SDS device 16L, to erase very tall NAND stacks by optimizing the bottom SGS device with respect to GIDL current (during erase) and off/leakage currents (during inhibit). The effective erase is from the source line 102 side only, which allows optimization of off current and leakage current (during inhibit and read) for top the SGD device 16U. This allows the device to open up inhibit window and reduce read current leakage for non selected blocks. Thus, the sub block erase could become effective compared to prior art 3D NAND devices.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A NAND device, comprising:
an array of vertical NAND strings, wherein:
   each NAND string comprises a semiconductor channel, a tunnel dielectric located adjacent to the semiconductor channel, a charge storage region located adjacent to the tunnel dielectric, and a blocking dielectric located adjacent to the charge storage region;
   at least one end portion of the semiconductor channel extending substantially perpendicular to a major surface of a substrate; and
   the array comprises at least a 3×3 array of NAND strings;
a plurality of control gate electrodes having a mesh shape extending substantially parallel to the major surface of the substrate, wherein the plurality of control gate electrodes comprise at least a first control gate electrode located in a first device level and a second control gate electrode located in a second device level located over the major surface of the substrate and below the first device level, wherein:
   the first control gate electrode and the second control gate electrode are continuous in the array.

2. The device of claim 1, wherein the first control gate electrode and the second control gate electrode do not have an air gap or a dielectric filled trench in the array.

3. The device of claim 1, wherein:
each semiconductor channel has a pillar shape; and
the entire pillar-shaped semiconductor channel extends substantially perpendicularly to the major surface of the substrate.

4. The device of claim 1, wherein each NAND string in the array further comprises:
one of a source or drain electrode which contacts the pillar-shaped semiconductor channel from above; and
another one of a source or drain electrode which contacts the pillar-shaped semiconductor channel from below.

5. The device of claim 4, wherein each NAND string in the array further comprises:
an upper select gate electrode which is located adjacent to an upper portion of the pillar-shaped semiconductor channel above the first and the second control gate electrodes; and
a lower select gate electrode which is located adjacent to a lower portion of the pillar-shaped semiconductor channel below the first and the second control gate electrodes.

6. The device of claim 5, wherein:
each upper select gate electrode is separated from adjacent upper select gate electrodes in the array by an air gap or a dielectric filled trench; and
each lower select gate electrode is separated from adjacent lower select gate electrodes in the array by an air gap or a dielectric filled trench.

7. The device of claim 6, wherein:
each semiconductor channel comprises a first portion adjacent to the upper select gate electrode, a second portion adjacent to the lower select gate electrode, a third portion located in the first and the second device levels between the first and the second portions, and a landing pad portion located between the second and the third portions;
the third portion has a larger diameter or width than the first and the second portions; and
the landing pad portion has a larger diameter or width than the second and the third portions.

8. The device of claim 7, wherein:
the semiconductor channel comprises a solid rod shaped channel or a hollow cylinder shaped channel;
the tunnel dielectric comprises a cylinder which surrounds the semiconductor channel;
the charge storage region comprises a cylinder which surrounds the tunnel dielectric;
the blocking dielectric comprises a cylinder which surrounds the charge storage region; and
the first and the second control gate electrodes surround the blocking dielectric in each NAND string.

9. The device of claim 8, wherein the charge storage regions comprise a plurality of vertically spaced apart floating gates or a dielectric charge storage layer.

10. The device of claim 8, wherein:
the tunnel dielectric, the charge storage region and the blocking dielectric in each NAND string comprise a memory film; and
the semiconductor channels and memory films in the array are arranged in a substantially hexagonal pattern comprising a central semiconductor channel and memory film unit surrounded by six other semiconductor channel and memory film units arranged in a substantially hexagonal layout around the central semiconductor channel and memory film unit.

11. The device of claim 1, wherein:
the array comprises at least a 4×6 array; and
the first control gate electrode and the second control gate electrode in the array are separated from respective first and second control gate electrodes in an adjacent array by an air gap or a dielectric filled trench.

12. The device of claim 11, further comprising a local interconnect which extends through the dielectric filled trench to contact a lower electrode located under the array.

13. A NAND device, comprising:
an array of vertical NAND strings, wherein:
   each NAND string comprises a semiconductor channel, a tunnel dielectric located adjacent to the semiconductor channel, a charge storage region located adjacent to the tunnel dielectric, and a blocking dielectric located adjacent to the charge storage region;
   at least one end portion of the semiconductor channel extending substantially perpendicular to a major surface of a substrate; and
   the array comprises at least a 3×3 array of NAND strings;
a plurality of control gate electrodes having a mesh shape extending substantially parallel to the major surface of the substrate, wherein the plurality of control gate electrodes comprise at least a first control gate electrode located in a first device level and a second control gate electrode located in a second device level located over the major surface of the substrate and below the first device level, wherein:

the first control gate electrode and the second control gate electrode do not have an air gap or a dielectric filled trench in the array.

14. The device of claim 13, wherein the first control gate electrode and the second control gate electrode are continuous in the array.

15. The device of claim 13, wherein:
each semiconductor channel has a pillar shape; and
the entire pillar-shaped semiconductor channel extends substantially perpendicularly to the major surface of the substrate.

16. The device of claim 13, wherein each NAND string in the array further comprises:
one of a source or drain electrode which contacts the pillar-shaped semiconductor channel from above; and
another one of a source or drain electrode which contacts the pillar-shaped semiconductor channel from below.

17. The device of claim 16, wherein each NAND string in the array further comprises:
an upper select gate electrode which is located adjacent to an upper portion of the pillar-shaped semiconductor channel above the first and the second control gate electrodes; and
a lower select gate electrode which is located adjacent to a lower portion of the pillar -shaped semiconductor channel below the first and the second control gate electrodes.

18. The device of claim 17, wherein:
each upper select gate electrode is separated from adjacent upper select gate electrodes in the array by an air gap or a dielectric filled trench; and
each lower select gate electrode is separated from adjacent lower select gate electrodes in the array by an air gap or a dielectric filled trench.

19. The device of claim 18, wherein:
each semiconductor channel comprises a first portion adjacent to the upper select gate electrode, a second portion adjacent to the lower select gate electrode, a third portion located in the first and the second device levels between the first and the second portions, and a landing pad portion located between the second and the third portions;

the third portion has a larger diameter or width than the first and the second portions; and
the landing pad portion has a larger diameter or width than the second and the third portions.

20. The device of claim 19, wherein:
the semiconductor channel comprises a solid rod shaped channel or a hollow cylinder shaped channel;
the tunnel dielectric comprises a cylinder which surrounds the semiconductor channel;
the charge storage region comprises a cylinder which surrounds the tunnel dielectric;
the blocking dielectric comprises a cylinder which surrounds the charge storage region; and
the first and the second control gate electrodes comprise metal control gate electrodes which surround the blocking dielectric in each NAND string.

21. The device of claim 20, wherein the charge storage regions comprise a plurality of vertically spaced apart floating gates or a dielectric charge storage layer.

22. The device of claim 20, wherein:
the tunnel dielectric, the charge storage region and the blocking dielectric in each NAND string comprise a memory film; and
the semiconductor channels and memory films in the array are arranged in a substantially hexagonal pattern comprising a central semiconductor channel and memory film unit surrounded by six other semiconductor channel and memory film units arranged in a substantially hexagonal layout around the central semiconductor channel and memory film unit.

23. The device of claim 13, wherein:
the array comprises at least a 4×6 array; and
the first control gate electrode and the second control gate electrode in the array are separated from respective first and second control gate electrodes in an adjacent array by an air gap or a dielectric filled trench.

24. The device of claim 23, further comprising a local interconnect which extends through the dielectric filled trench to contact a lower electrode located under the array.

* * * * *